US008108361B2

(12) United States Patent
Netz et al.

(10) Patent No.: US 8,108,361 B2
(45) Date of Patent: Jan. 31, 2012

(54) EFFICIENT COLUMN BASED DATA ENCODING FOR LARGE-SCALE DATA STORAGE

(75) Inventors: Amir Netz, Bellevue, WA (US);
Cristian Petculescu, Redmond, WA (US); Ioan Bogdan Crivat, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 538 days.

(21) Appl. No.: 12/270,873

(22) Filed: Nov. 14, 2008

(65) Prior Publication Data
US 2010/0030796 A1 Feb. 4, 2010

Related U.S. Application Data

(60) Provisional application No. 61/085,023, filed on Jul. 31, 2008.

(51) Int. Cl.
*G06F 17/30* (2006.01)
(52) U.S. Cl. ............... 707/687; 707/693; 380/28
(58) Field of Classification Search .......... 707/667–693; 380/28
See application file for complete search history.

(56) References Cited

U.S. PATENT DOCUMENTS

| 6,049,630 | A | 4/2000 | Wang et al. |
| 6,330,363 | B1 | 12/2001 | Accad |
| 6,339,616 | B1 * | 1/2002 | Kovalev ............ 375/240.16 |
| 6,567,559 | B1 | 5/2003 | Easwar |
| 6,633,674 | B1 | 10/2003 | Barnes et al. |
| 6,680,976 | B1 | 1/2004 | Chen et al. |
| 6,801,573 | B2 | 10/2004 | Zheng |
| 7,340,103 | B2 * | 3/2008 | Smirnov ............ 382/245 |
| 2002/0143521 | A1 * | 10/2002 | Call .................... 704/1 |
| 2007/0019877 | A1 | 1/2007 | Chen et al. |
| 2007/0081588 | A1 * | 4/2007 | Raveendran et al. ...... 375/240.1 |
| 2008/0170613 | A1 * | 7/2008 | Tian et al. ............. 375/240.03 |
| 2009/0006309 | A1 * | 1/2009 | Hunt et al. ............. 707/1 |
| 2009/0018996 | A1 * | 1/2009 | Hunt et al. ............. 707/2 |

FOREIGN PATENT DOCUMENTS

WO 2008048185 A1 4/2008

OTHER PUBLICATIONS

Daniel J. Abadi, et al. Integrating Compression and Execution in Column-Oriented Database Systems http://web.mit.edu/dna/www/abadisigmod06.pdf. Last accessed on Jul. 28, 2008, 12 pages.

(Continued)

*Primary Examiner* — Hanh Thai
(74) *Attorney, Agent, or Firm* — Workman Nydegger

(57) ABSTRACT

The subject disclosure relates to column based data encoding where raw data to be compressed is organized by columns, and then, as first and second layers of reduction of the data size, dictionary encoding and/or value encoding are applied to the data as organized by columns, to create integer sequences that correspond to the columns. Next, a hybrid greedy run length encoding and bit packing compression algorithm further compacts the data according to an analysis of bit savings. Synergy of the hybrid data reduction techniques in concert with the column-based organization, coupled with gains in scanning and querying efficiency owing to the representation of the compact data, results in substantially improved data compression at a fraction of the cost of conventional systems.

14 Claims, 29 Drawing Sheets

OTHER PUBLICATIONS

Ali Pinar, et al. Compressing Bitmap Indices by Data Reorganization http://www.cse.ohio-state.edu/~hakan/publications/reordering_ICDE05.pdf. Last accessed on Jul. 28, 2008, 12 pages.

Mike Stonebraker, et al. C-Store: A Column-Oriented DBMS http://people.brandeis.edu/~nga/papers/VLDB05.pdf. Last accessed on Jul. 28, 2008, 12 pages.

Stavros Harizopoulos, et al. Performance Tradeoffs in Read-Optimized Databases http://db.csail.mit.edu/pubs/harizopoulosVLDB06.pdf. Last accessed on Jul. 28, 2008, 12 pages.

Stavros Harizopoulos, et al., Performance Tradeoffs in Read-Optimized Databases http://db.csail.mit.edu/pubs/harizopoulosVLDB06.pdf. Last accessed on Jul. 28, 2008, 12 pages.

\* cited by examiner

Row Representation 560

| | Name 510 | Phone 520 | Email 530 | Address 540 | State 550 |
|---|---|---|---|---|---|
| Record 500 | Jon 511 | 555-1212 521 | Jon@go 531 | 2 1st St 541 | Wash 551 |
| Record 501 | Amy 512 | 123-4567 522 | Amy@wo 532 | 1 2nd Pl 542 | Mont 552 |
| Record 502 | Jimmy 513 | 765-4321 523 | Jim@so 533 | 9 Fly Rd 543 | Oreg 553 |
| Record 503 | Kim 514 | 987-6543 524 | Kim@to 534 | 91 Y St 544 | Miss 554 |

→ Columnization →

Reorganized Column Representation 570

| | | | | |
|---|---|---|---|---|
| Column 1 | Jon 511 | Amy 512 | Jimmy 513 | Kim 514 |
| Column 2 | 555-1212 521 | 123-4567 522 | 765-4321 523 | 987-6543 524 |
| Column 3 | Jon@go 531 | Amy@wo 532 | Jim@so 533 | Kim@to 534 |
| Column 4 | 2 1st St 541 | 1 2nd Pl 542 | 9 Fly Rd 543 | 91 Y St 544 |
| Column 5 | Wash 551 | Mont 552 | Oreg 553 | Miss 554 |

Pure Bucket 2000
Single Impurity Bucket 2010
Double Impurity Bucket 2010

C1  C2  C3  ...  Cn

Sample Query 2300 with Sample Query Building Blocks

```
SELECT GB_Col1, GB_Col2,...,
       Count(*), Sum(Agg_Col1), Sum(Agg_Col2)...
FROM FactTable JOIN DimensionTable1, DimensionTable2..
GROUP BY GB_Col1, GB_Col2...
WHERE Filter_Col1 = value,...
```

Sample "Aggregate by Column" Query Building Block 2306

Sample "Group by Column" Query Building Block 2304

Sample "Filter by Column" Query Building Block 2302

Organize the data according to a set of column based sequences of values corresponding to different data fields of the data organizing the data according to a set of column based sequences of values corresponding to different data fields of the data.

2510

Transform the set of column based sequences of values to a set of column based integer sequences of values according to at least one encoding algorithm, such as dictionary encoding and/or value encoding.

2520

Compress the set of column based integer sequences according to at least one compression algorithm, including a greedy run length encoding algorithm applied across the set of column based integer sequences or a bit backing algorithm, or a combination of run length encoding and bit packing.

In response to query, a subset of the data is retrieved as integer encoded and compressed sequences of values corresponding to different columns of the data.

2710

Processing buckets are defined that span over the subset of the data based on changes of compression type occurring in any of the integer encoded and compressed sequences of values of the subset of data.

2720

Query operations are performed based on type of current bucket being processed for efficient query processing.

FIG. 27

EFFICIENT COLUMN BASED DATA ENCODING FOR LARGE-SCALE DATA STORAGE

PRIORITY CLAIM

The present application claims priority to U.S. Provisional Application No. 61/085,023, filed Jul. 31, 2008, entitled "EFFICIENT COLUMN BASED DATA ENCODING FOR LARGE-SCALE DATA STORAGE", the entirety of which is incorporated herein by reference.

TECHNICAL FIELD

The subject disclosure generally relates to efficient column based encoding of data for reducing the size of large-scale amounts of data and increasing the speed of processing or querying the data.

BACKGROUND

By way of background concerning conventional compression, when a large amount of data is stored in a database, such as when a server computer collects large numbers of records, or transactions, of data over long periods of time, other computers sometimes desire access to that data or a targeted subset of that data. In such case, the other computers can query for the desired data via one or more query operators. In this regard, historically, relational databases have evolved for this purpose, and have been used for such large scale data collection, and various query languages have developed which instruct database management software to retrieve data from a relational database, or a set of distributed databases, on behalf of a querying client.

Traditionally, relational databases have been organized according to rows, which correspond to records, having fields. For instance, a first row might include a variety of information for its fields corresponding to columns (name1, age1, address1, sex1, etc.), which define the record of the first row and a second row might include a variety of different information for fields of the second row (name2, age2, address2, sex2, etc.). However, traditionally, querying over enormous amounts of data, or retrieving enormous amounts of data for local querying or local business intelligence by a client have been limited in that they have not been able to meet real-time or near real-time requirements. Particularly in the case in which the client wishes to have a local copy of up-to-date data from the server, the transfer of such large scale amounts of data from the server given limited network bandwidth and limited client cache storage has been impractical to date for many applications.

For instance, currently, scanning and aggregating 600 million rows of data having approximately 160 bytes of data each (about 100 Gigabytes of data), using two "group by" operations and four aggregate operations as a sample query, the fastest known relational database management system (RDBMS), as measured by industry standard TPC-H metrics, can deliver and process the data in about 39.9 seconds. This represents delivery at an approximate bit rate of 2.5 Gb/sec, or about 15 million rows/sec. However, today's state of the art system runs almost $200,000 from a cost standpoint, a high barrier to entry for most users. Moreover, 39.9 seconds, while fast, does not begin to meet the tightest of real-time demands and requirements, and otherwise leaves much room for improvement.

By way of further background, due to the convenience of conceptualizing differing rows as differing records with relational databases as part of the architecture, techniques for reducing data set size have thus far focused on the rows due to the nature of how relational databases are organized. In other words, the row information preserves each record by keeping all of the fields of the record together on one row, and traditional techniques for reducing the size of the aggregate data have kept the fields together as part of the encoding itself.

Run-length encoding (RLE) is a conventional form of data compression in which runs of data, that is, sequences in which the same data value occurs in many consecutive data elements, are stored as a single data value and count, rather than as the original run. In effect, instead of listing "EEEEEE" as an entry, a run length of "6 Es" is defined for the slew of Es. RLE is useful on data that contains many such runs, for example, relatively simple graphic images such as icons, line drawings, and animations. However, where data tends to be unique from value to value, or pixel to pixel, etc., or otherwise nearly unique everywhere, RLE is known to be less efficient. Thus, sometimes RLE, by itself, does not lend itself to efficient data reduction, wasting valuable processing time for little to no gain.

Another type of compression that has been applied to data includes dictionary encoding, which operates by tokenizing field data values to a reduced bit set, such as sequential integers, in a compacted representation via a dictionary used alongside of the resulting data to obtain the original field data values from the compacted representation.

Another type of compression that has been applied to data includes value encoding, which converts real numbers into integers by performing some transformation over the data enabling a more compact representation, e.g., applying an invertible mathematical function over the data, which reduces the number of bits needed to represent the data. For instance, real numbers, such as float values, take up more space in memory than integer values, and thus invertibly converting float values to integer values reduces storage size and then a processor that uses the data can derive the float values when needed.

Still another type of compression that has been applied to data includes bit packing, which counts the number of distinct values of data or determines the range over which the different values span, and then represents that set of numbers or values with the minimum number of bits as determined by an optimization function. For instance, perhaps the each field of a given column spans only a limited range, and thus instead of representing each value with, e.g., 10 bits as originally defined for the field, it may turn out that only 6 bits are needed to represent the values. Bit packing re-stores the values according to the more efficient 6 bit representation of the data.

Each of these conventional compression techniques has been independently applied to the row-organized information of relational databases, e.g., via rowset operators, yet, each of these techniques suffers disadvantages in that none adequately address the problem of satisfying the delivery of huge amounts of data from a database quickly to a consuming client, which may have real-time requirements, for up-to-date data. Mainly, the conventional methodologies have focused on reducing the size of data stored to maximize the amount of data that can be stored for a given disk size or storage limit.

However, these techniques on their own can actually end up increasing the amount of processing time over the data according to a scan or query of the data due to data intensive decoding or the monolithic size of the compressed storage structures that must be transmitted to complete the inquiry. For instance, with many conventional compression techniques, the longer it takes to compress the data, the greater the savings that are achieved with respect to size; however, on the other hand, the longer it takes to compress the data with such conventional compression schemes, the longer it takes to decompress and process as a result. Accordingly, conventional systems fail to provide a data encoding technique that not only compresses data, but also compresses the data in a way that makes querying, searching and scanning of the data faster.

In addition, limitations in network transmission bandwidth inherently limit how quickly compressed data can be received by the client, placing a bottleneck on the request for massive amounts of data. It would thus be desirable to provide a solution that achieves simultaneous gains in data size reduction and query processing speed. It would be further desirable to provide an improved data encoding technique that enables highly efficient compression and processing in a query based system for large amounts of data.

The above-described deficiencies of today's relational databases and corresponding compression techniques are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

Embodiments of column based data encoding are described. In various non-limiting embodiments, raw data to be compressed is organized by columns, and then, as first and second layers of reduction of the data size, dictionary encoding and/or value encoding are applied to the data as organized by columns, to create integer sequences that correspond to the columns. Next, as an additional layer of compression, a hybrid run length encoding and bit packing algorithm can further compact the data. In one embodiment, the hybrid run length encoding and bit packing operates according to an iterative compression analysis for a given data set that favors run length encoding for a column where maximal compression savings are achieved. According to the compression analysis, run length encoding is not used where savings are relatively insignificant, e.g., when the remaining data set values of a column to which run length encoding has not been applied are relatively unique from one another. Instead, bit packing is used in such circumstances.

Synergy of the hybrid data reduction techniques in concert with the column-based organization, coupled with gains in scanning and querying efficiency owing to the column based compact representation, results in substantially improved data compression at a fraction of the cost of conventional systems, e.g., a factor of 400 times faster at less than 1/10 the cost of the fastest known conventional system.

These and other embodiments are described in more detail below.

BRIEF DESCRIPTION OF THE DRAWINGS

Various non-limiting embodiments are further described with reference to the accompanying drawings in which:

FIG. 5 is a non-limiting block diagram exemplifying columnization of record data;

FIG. 20 illustrates impurity levels with respect to bucketization of the columns in accordance with an embodiment;

FIG. 23 illustrates exemplary non-limiting query building blocks for query languages for specifying queries over data in a standardized manner;

FIG. 25 is a flow diagram illustrating a process for encoding data according to columns according to a variety of embodiments;

FIG. 27 is a flow diagram illustrating a process for querying over the column based representations of data;

DETAILED DESCRIPTION

Overview

As discussed in the background, among other things, conventional systems do not adequately handle the problem of reading tremendous amounts of data from a server, or other data store in "the cloud," in memory very fast due to limits on current compression techniques, limits on transmission bandwidth over networks and limits on local cache memory. For instance, reading the equivalent of 1.5 Terabytes of data per second would be a tremendous feat, and is cost prohibitive today, with the leading expensive conventional solution operating at a fraction of that speed (~2.5 Gb/sec).

Accordingly, in various non-limiting embodiments, a column oriented encoding technique is applied to large amounts of data to compact the data and simultaneously organize the data to make later scan/search/query operations over the data substantially more efficient. As a roadmap for what follows, an overview of various embodiments is first described and then exemplary, non-limiting optional implementations are discussed in more detail for supplemental context and understanding. First, the column based encoding techniques for packing large amounts of data are described including an exemplary embodiment that adaptively trades off the performance benefits of run length encoding and bit packing via a hybrid compression technique.

In an exemplary non-limiting embodiment, after columnizing raw data to a set of value sequences, one for each column (e.g., serializing the fields of the columns of data, e.g., all Last Names as one sequence, or all PO Order #s as another sequence, etc.), the data is "integerized" to form integer sequences for each column that are uniformly represented according to dictionary encoding, value encoding, or both dictionary and value encoding, in either order. This integerization stage results in uniformly represented column vectors, and can achieve significant savings by itself, particularly where long fields are recorded in the data, such as text strings. Next, examining all of the columns, a compression stage iteratively applies run length encoding to the run of any of the columns that will lead to the highest amount of overall size savings on the overall set of column vectors.

As mentioned, the packing technique is column based, not only providing superior compression, but also the compression technique itself aids in processing the data quickly once the compacted integer column vectors are delivered to the client side.

Figure 1:
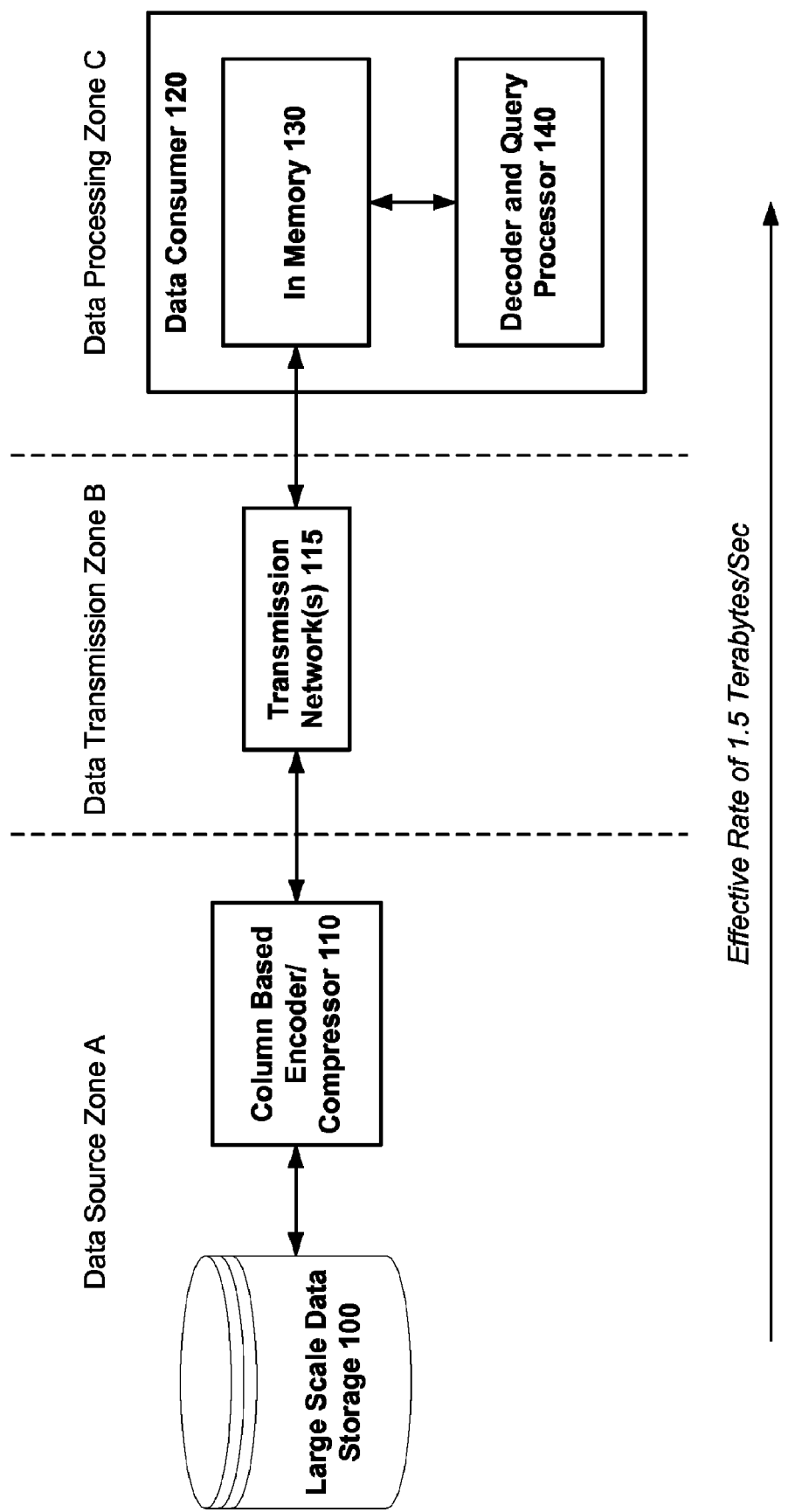
FIG. 1 is a general block diagram illustrating a column based encoding technique and in memory client side processing of queries over the encoded data.

In various non-limiting embodiments, as shown in FIG. 1, a column based encoder/compressor 110 is provided for compacting large scale data storage 100 and for making resulting scan/search/query operations over the data substantially more efficient as well. In response to a query by a data consuming device 120 in data processing zone C, compressor 110 transmits the compressed columns that are pertinent to the query over transmission network(s) 115 of data transmission zone B. The data is delivered to in memory storage 130, and thus decompression of the pertinent columns can be performed very fast by decoder and query processor 140 in data processing zone C. In this regard, a bucket walking is applied to the rows represented by the decompressed columns pertinent to the query for additional layers of efficient processing. Similarity of rows is exploited during bucket walking such that repetitive acts are performed together. As described in more detail below, when the technique is applied to real world sample data, such as large quantities of web traffic data or transaction data, with a standard, or commodity server having 196 Gb RAM, query/scan of server data is achieved at approximately 1.5 Terabytes of data per second, an astronomical leap over the capabilities of conventional systems, and at substantially reduced hardware costs.

While the particular type of data that can be compressed is by no means limited to any particular type of data and the number of scenarios that depend upon large scale scan of enormous amounts of data are similarly limitless, the commercial significance of applying these techniques to business data or records in real-time business intelligence applications cannot be doubted. Real-time reporting and trend identification is taken to a whole new level by the exorbitant gains in query processing speed achieved by the compression techniques.

Column Based Data Encoding

As mentioned in the overview, column oriented encoding and compression can be applied to large amounts of data in various embodiments to compact and simultaneously organize the data to make later scan/search/query operations over the data substantially more efficient. In various embodiments, to begin the encoding and compression, the raw data is initially re-organized as columnized streams of data.

Figure 2:
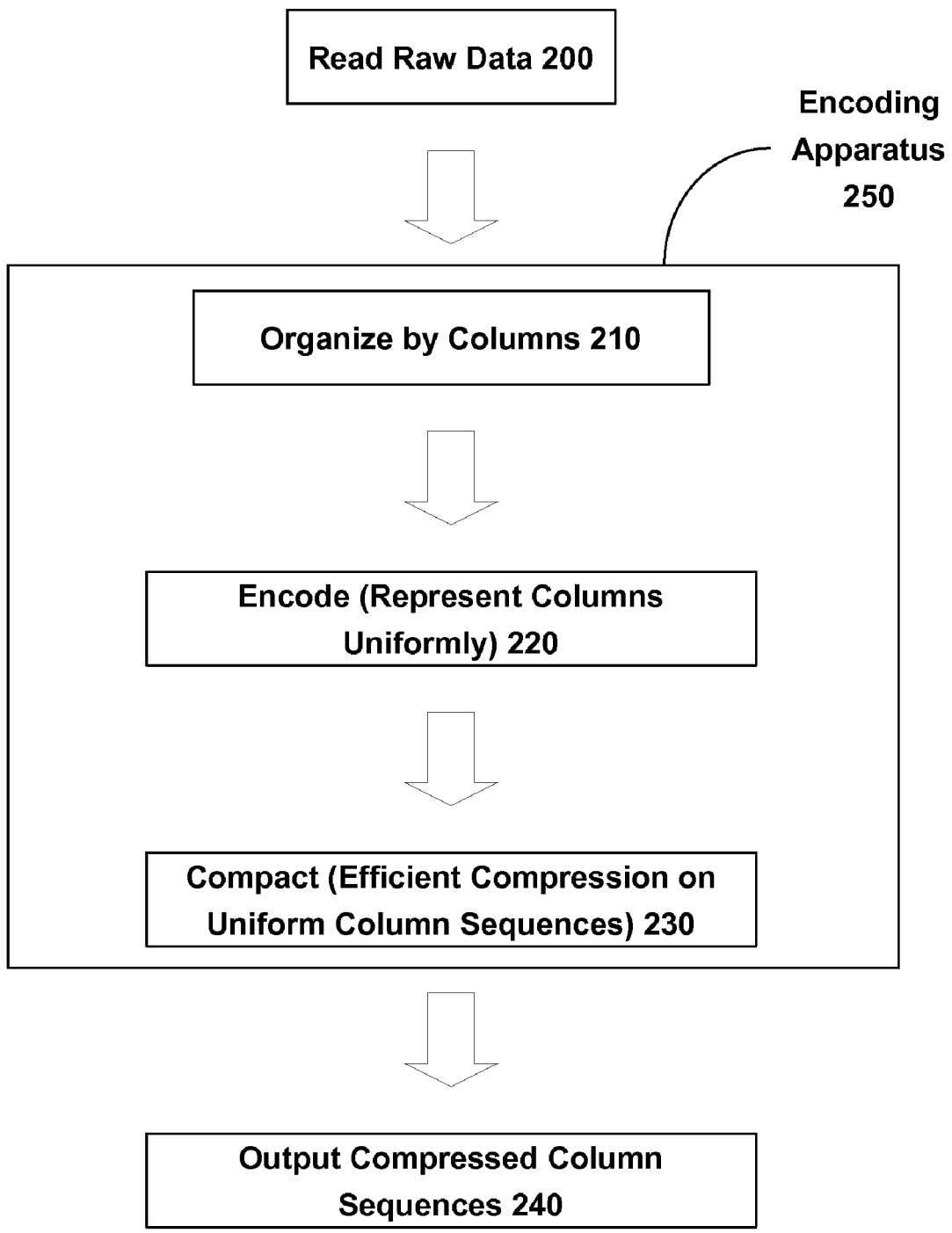
FIG. 2 is a block diagram illustrating an exemplary non-limiting implementation of encoding apparatus employing column based encoding techniques.

One embodiment of an encoder is generally shown in FIG. 2 in which raw data is received, or read from storage at 200 at which point encoding apparatus and/or encoding software 250 organizes the data as columns at 210. At 220, the column streams are transformed to a uniform vector representation. For instance, integer encoding can be applied to map individual entries like names or places to integers. Such integer encoding technique can be a dictionary encoding technique, which can reduce the data by a factor of 2x-10x. In addition, or alternatively, a value encoding can further provide a 1x-2x reduction in size. This leaves a vector of integers for each column at 220. Such performance increases are sensitive to the data being compacted, and thus such size reduction ranges are given merely as non-limiting estimates to give a general idea of relative performance of the different steps.

Then, at 230, the encoded uniform column vectors can be compacted further. In one embodiment, a run length encoding technique is applied that determines the most frequent value or occurrence of a value across all the columns, in which case a run length is defined for that value, and the process is iterative up to a point where benefits of run length encoding are marginal, e.g., for recurring integer values having at least 64 occurrences in the column.

In another embodiment, the bit savings from applying run length encoding are examined, and at each step of the iterative process, the column of the columns is selected that achieves the maximum bit savings through application of re-ordering and definition of a run length. In other words, since the goal is to represent the columns with as few bits as possible, at each step, the bit savings are maximized at the column providing the greatest savings. In this regard, run length encoding can provide significant compression improvement, e.g., 100× more, by itself.

In another embodiment, a hybrid compression technique is applied at 230 that employs a combination of bit packing and run length encoding. A compression analysis is applied that examines potential savings of the two techniques, and where, for instance, run length encoding is deemed to result in insufficient net bit savings, bit packing is applied to the remaining values of a column vector. Thus, once run length savings are determined to be minimal according to one or more criteria, the algorithm switches to bit packing for the remaining relatively unique values of the column. For instance, where the values represented in a column become relatively unique (where the non-unique or repetitive values are already run length encoded), instead of run length encoding, bit packing can be applied for those values. At 240, the output is a set of compressed column sequences corresponding to the column values as encoded and compressed according to the above-described technique.

Figure 3:
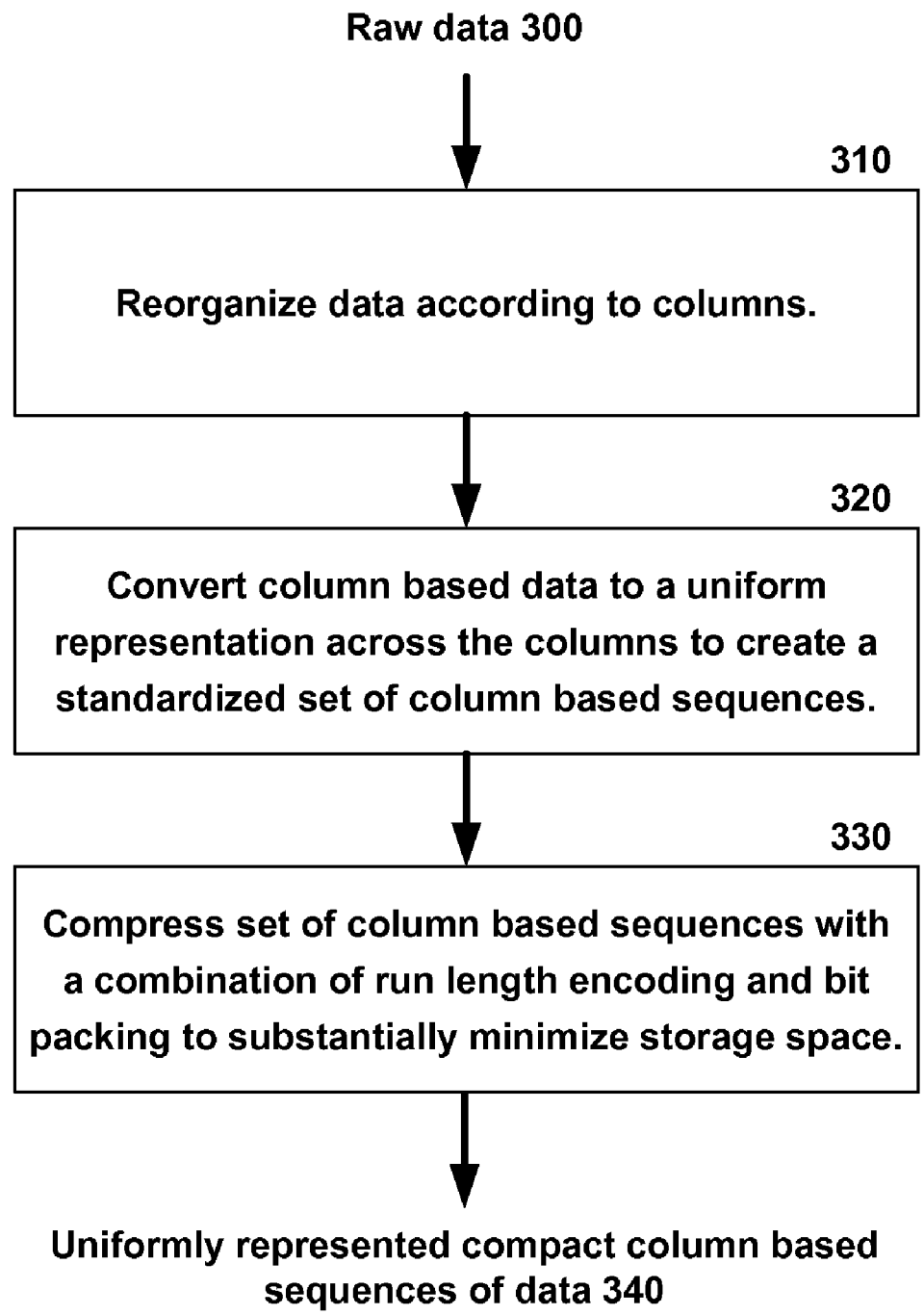
FIG. 3 is a flow diagram illustrating an exemplary non-limiting process for applying column based encoding to large scale data.
Figure 4:
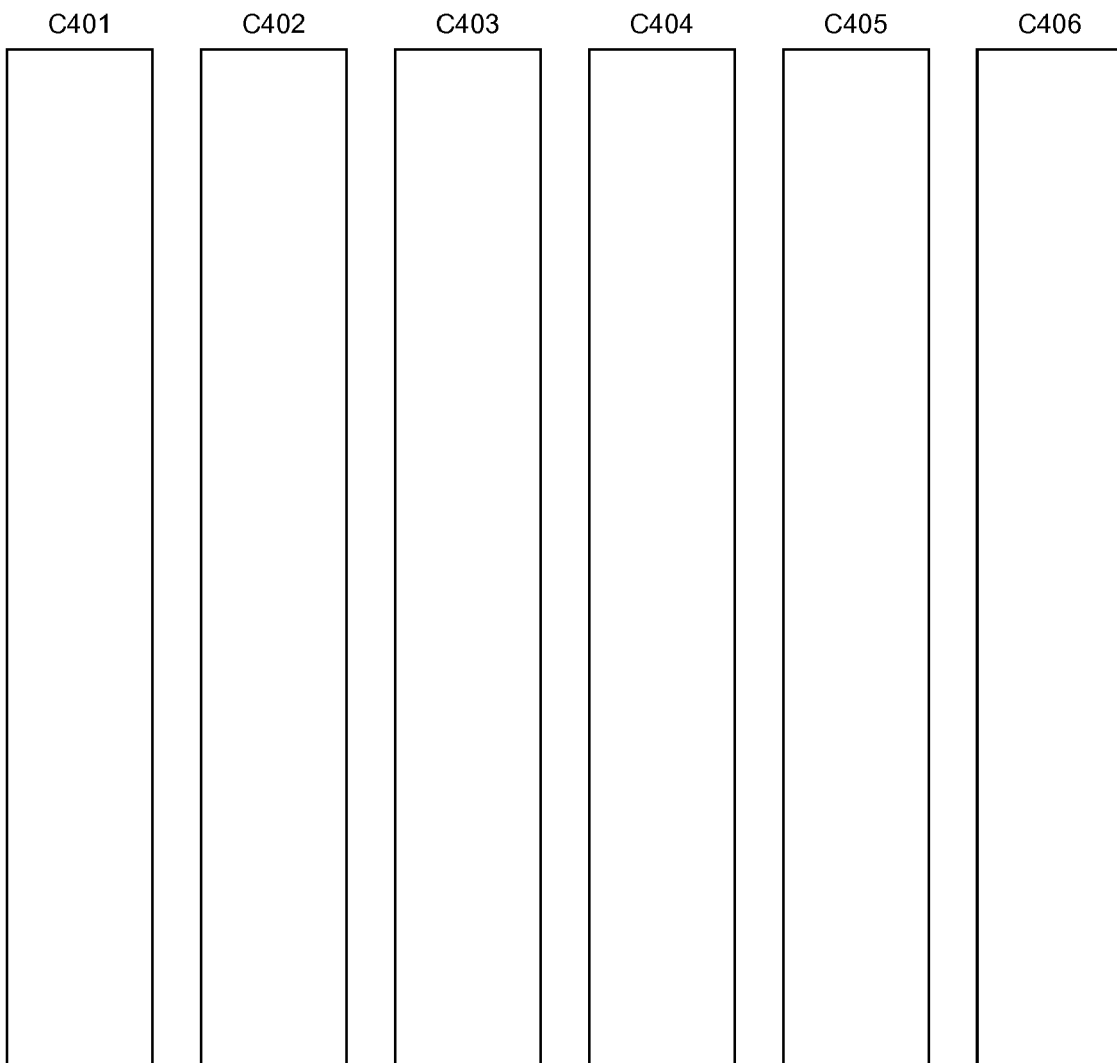
FIG. 4 is an illustration of column based representation of raw data in which records are broken into their respective fields and the fields of the same type are then serialized to form a vector.
Figure 6:
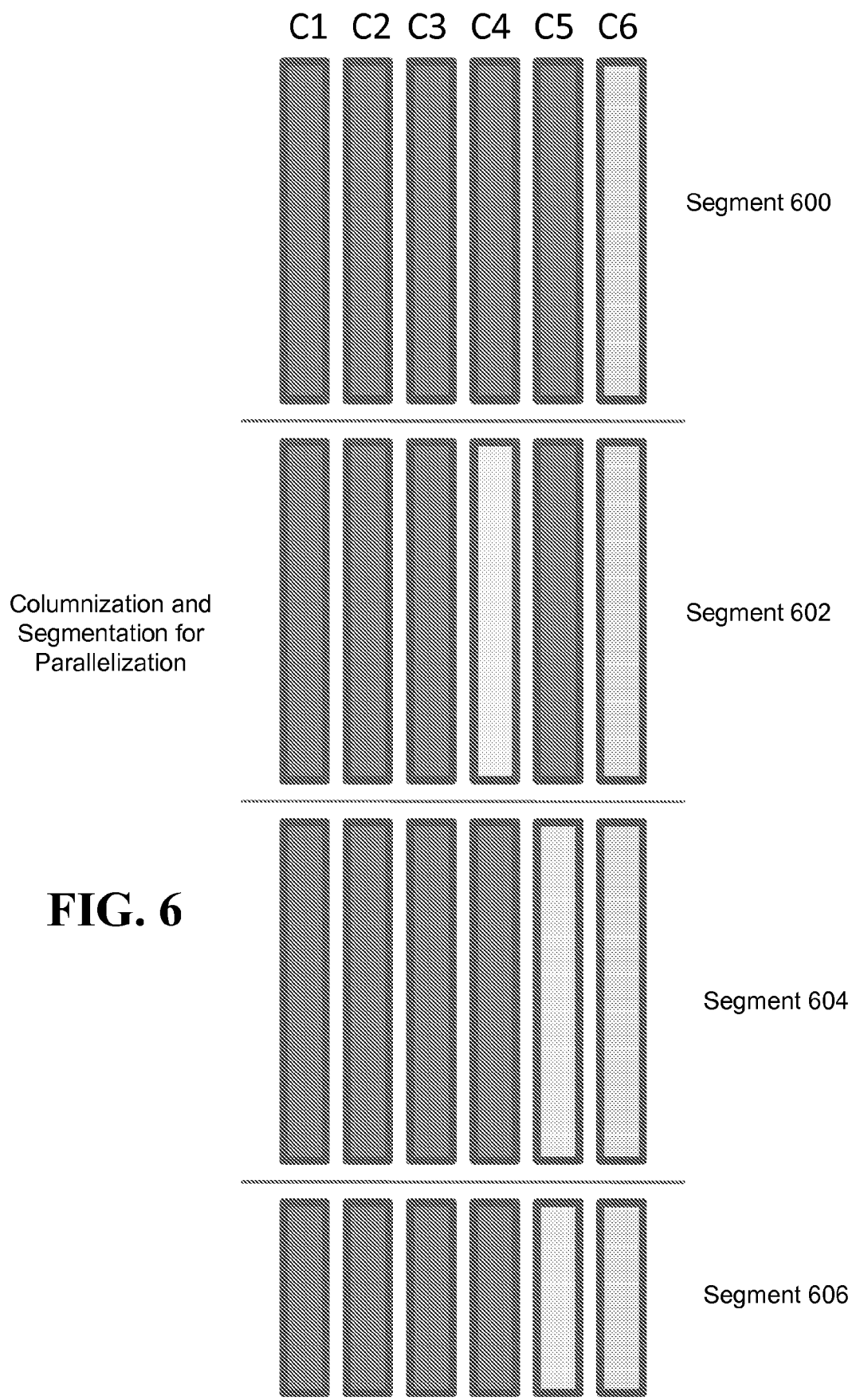
FIG. 6 illustrates that the work of in memory client-side processing of the column data received in connection with a query can be split among multiple cores so as to share the burden of processing large numbers of rows across the column organization.

FIG. 3 generally describes the above methodology according to a flow diagram beginning with the input of raw data 300. At 310, as mentioned, the data is reorganized according to the columns of the raw data 300, as opposed to keeping each field of a record together like conventional systems. For instance, as shown in FIG. 4, each column forms an independent sequence, such as sequences C401, C402, C403, C404, C405, C406. Where retail transaction data is the data, for example, column C401 might be a string of product prices, column C402 might represent a string of purchase dates, column C403 might represent a store location, and so on. The column based organization maintains inherent similarity within a data type considering that most real world data collected by computer systems is not very diverse in terms of the values represented. At 320, the column based data undergoes one or more conversions to form uniformly represented column based data sequences. In one embodiment, step 320 reduces each column to integer sequences of data via dictionary encoding and/or value encoding.

At 330, the column based sequences are compressed with a run length encoding process, and optionally bit packing. In one embodiment, the run-length encoding process re-orders the column data value sequences of the column of all of the columns which achieves the highest compression savings. Thus, the column where run length encoding achieves the highest savings, is re-ordered to group the common values being replaced by run length encoding, and then a run length is defined for the re-ordered group. In one embodiment, the run length encoding algorithm is applied iteratively across the columns, examining each of the columns at each step to determine the column that will achieve the highest compression savings.

When the benefit of applying run length encoding becomes marginal or minimal according to one or more criterion, such as insufficient bit savings, or savings are less than a threshold, then the benefits of its application correspondingly go down. As a result, the algorithm can stop, or for the remaining values not encoded by run length encoding in each column, bit packing can be applied to further reduce the storage requirements for those values. In combination, the hybrid run length encoding and bit packing technique can be powerful to reduce a column sequence, particularly those with a finite or limited number of values represented in the sequence.

For instance, the field "sex" has only two field values: male and female. With run length encoding, such field could be represented quite simply, as long as the data is encoded according to the column based representation of raw data as described above. This is because the row focused conventional techniques described in the background, in effect, by keeping the fields of each record together, break up the commonality of the column data. "Male" next to an age value such as "21" does not compress as well as a "male" value next to only "male" or "female" values. Thus, the column based organization of data enables efficient compression and the result of the process is a set of distinct, uniformly represented and compacted column based sequences of data 340.

FIG. 5 gives an example of the columnization process based on actual data. The example of FIG. 5 is for 4 data records 500, 501, 502 and 503, however, this is for simplicity of illustration since the invention can apply to terabytes of data. Generally speaking, when transaction data is recorded by computer systems, it is recorded record-by-record and generally in time order of receiving the records. Thus, the data in effect has rows, which correspond to each record.

In FIG. 5, record 500 has name field 510 with value "Jon" 511, phone field 520 with value "555-1212" 521, email field 530 with value "jon@go" 531, address field 540 with value "2 $1^{st}$ St" 541 and state field 550 with value "Wash" 551.

Record 501 has name field 510 with value "Amy" 512, phone field 520 with value "123-4567" 522, email field 530 with value "Amy@wo" 532, address field 540 with value "1 $2^{nd}$ P1" 542 and state field 550 with value "Mont" 552.

Record 502 has name field 510 with value "Jimmy" 513, phone field 520 with value "765-4321" 523, email field 530 with value "Jim@so" 533, address field 540 with value "9 Fly Rd" 543 and state field 550 with value "Oreg" 553.

Record 503 has name field 510 with value "Kim" 514, phone field 520 with value "987-6543" 524, email field 530 with value "Kim@to" 534, address field 540 with value "91 Y St" 544 and state field 550 with value "Miss" 554.

When row representation 560 is columnized to reorganized column representation 570, instead of having four records each having five fields, five columns are formed corresponding to the fields.

Thus, column 1 corresponds to the name field 510 with value "Jon" 511, followed by value "Amy" 512, followed by value "Jimmy" 513, followed by value "Kim" 514. Similarly, column 2 corresponds to the phone field 520 with value "555-1212" 521, followed by value "123-4567" 522, followed by value "765-4321" 523, followed by value "987-6543" 524. Column 3 corresponds to the email field 530 with value "jon@go" 531, followed by value "Amy@wo" 532, followed by value "Jim@so" 533, followed by value "Kim@to" 534. In turn, column 4 corresponds to the address field 540 with value "2 $1^{st}$ St" 541, followed by value "$12^{nd}$ P1" 542, followed by value "9 Fly Rd" 543, followed by value "91 Y St" 544. And column 5 corresponds to the state field 550 with value "Wash" 551, followed by value "Mont" 552, followed by value "Oreg" 553, followed by value "Miss" 554.

In one embodiment, when compressed columns according to the above-described technique are loaded in memory on a consuming client system, the data is segmented across each of the columns C1, C2, C3, C4, C5, C6 to form segments 600, 602, 604, 606, etc. In this regard, since each segment can include 100s of millions of rows or more, parallelization improves the speed of processing or scanning the data, e.g., according to a query. The results of each segment are aggregated to form a complete set of results while each segment is processed separately.

Figure 7:
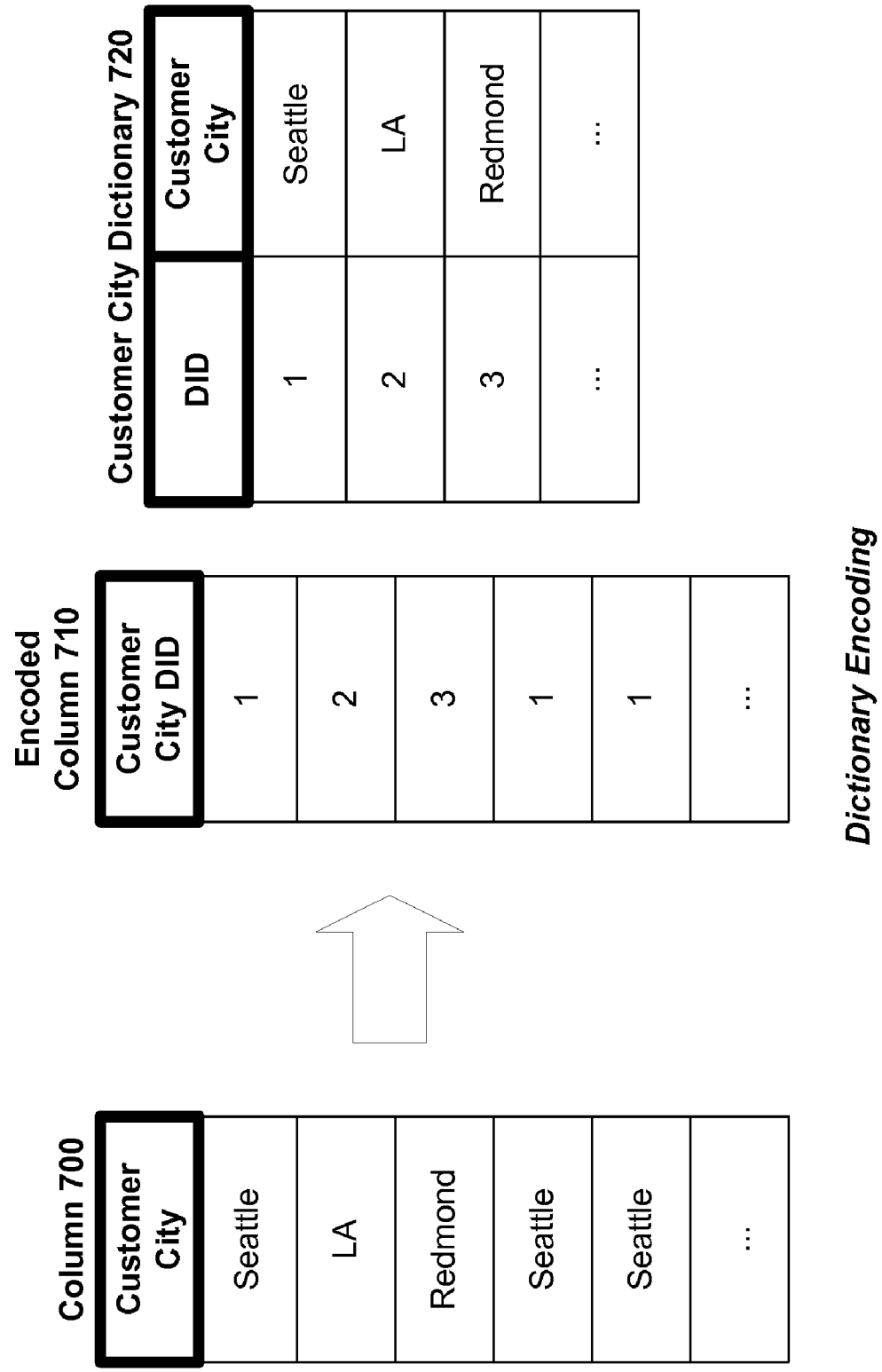
FIG. 7 is a non-limiting block diagram illustrating the concept of dictionary encoding.

FIG. 7 is a block diagram illustrative of a non-limiting example of dictionary encoding, as employed by embodiments described herein. A typical column 700 of cities may include values "Seattle," "Los Angeles," "Redmond" and so on, and such values may repeat themselves over and over. With dictionary encoding, an encoded column 710 includes a symbol for each distinct value, such as a unique integer per value. Thus, instead of representing the text "Seattle" many times, the integer "1" is stored, which is much more compact. The values that repeat themselves more often can be enumerated with mappings to the most compact representations (fewest bits, fewest changes in bits, etc.). The value "Seattle" is still included in the encoding as part of a dictionary 720, but "Seattle" need only be represented once instead of many times. The extra storage implicated by the dictionary 720 is far outweighed by the storage savings of encoded column 710.

Figure 8:
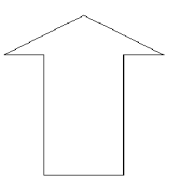
FIG. 8 is a non-limiting block diagram illustrating the concept of value encoding.

FIG. 8 is a block diagram illustrative of a non-limiting example of value encoding, as employed by embodiments described herein. A column 800 represents sales amounts and includes a typical dollars and cents representation including a decimal, which implicates float storage. To make the storage more compact, a column 810 encoded with value encoding may have applied to it a factor of 10, e.g., $10^2$, in order to represent the values with integers instead of float values, with integers requiring fewer bits to store. The transformation can similarly be applied in reduce the number of integers representing a value. For instance, values consistently ending in the millions for a column, such as 2,000,000, 185,000,000, etc. can all be divided by $10^6$ to reduce the values to more compact representations 2, 185, etc.

Figure 9:
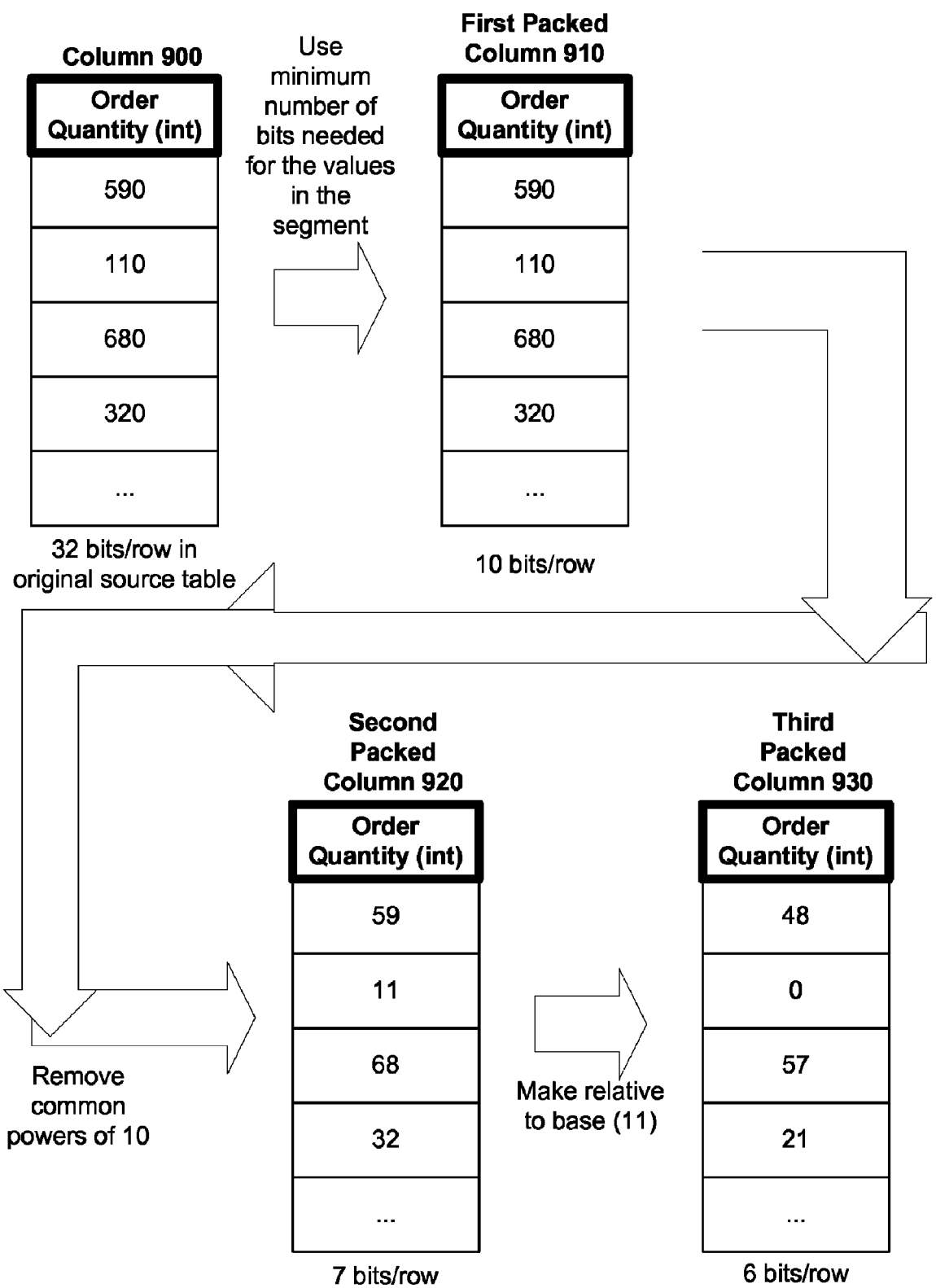
FIG. 9 is a non-limiting block diagram illustrating the concept of bit packing applied in one aspect of a hybrid compression technique.

FIG. 9 is a block diagram illustrative of a non-limiting example of bit packing, as employed by embodiments described herein. A column 900 represents order quantities as integerized by dictionary and/or value encoding, however, 32 bits per row are reserved to represent the values. Bit packing endeavors to use the minimum number of bits for the values in the segment. In this example, 10 bits/row can be used to represent the values 590, 110, 680 and 320, representing a substantial savings for the first layer of bit packing applied to form column 910.

Bit packing can also remove common powers of 10 (or other number) to form a second packed column 920. Thus, if the values end in 0 as in the example, that means that the 3 bits/row used to represent the order quantities are not needed reducing the storage structure to 7 bits/row. Similar to the dictionary encoding, any increased storage due to the metadata needed to restore the data to column 900, such as what power of 10 was used, is vastly outweighed by the bit savings.

As another layer of bit packing to form third packed column 930, it can be recognized that it takes 7 bits/row to represent a value like 68, but since the lowest value is 11, the range can be shifted by 11 (subtract each value by 11), and then the highest number is 68−11=57, which can be represented with just 6 bits/row since $2^6=64$ value possibilities. While FIG. 9 represents a particular order of packing layers, the layers can be performed in different orders, or alternatively, the packing layers can be selectively removed or supplemented with other known bit packing techniques.

Figure 10:
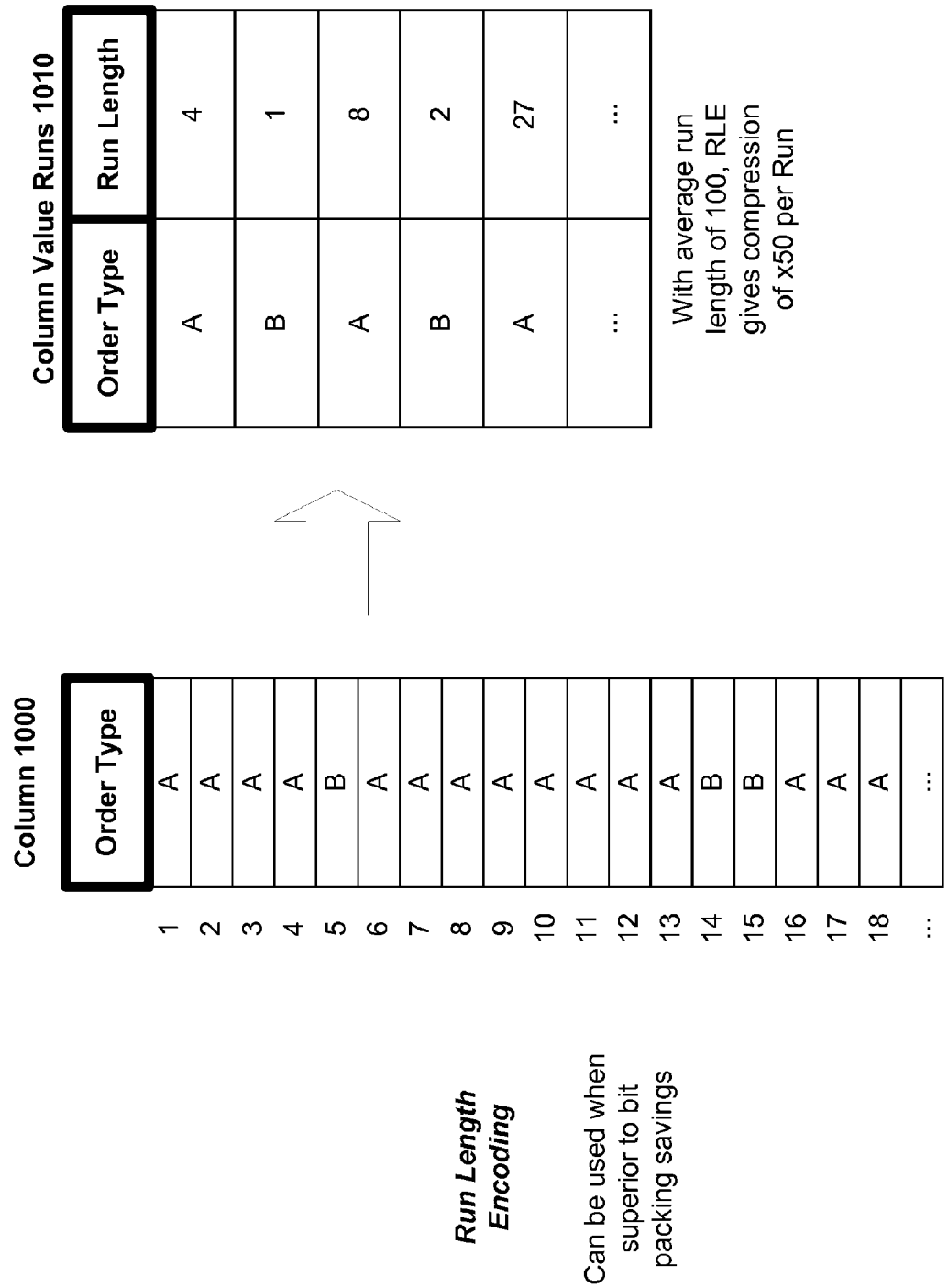
FIG. 10 is a non-limiting block diagram illustrating the concept of run length encoding applied in another aspect of a hybrid compression technique.

FIG. 10 is a block diagram illustrative of a non-limiting example of run length encoding, as employed by embodiments described herein. As illustrated, a column such as column 1000 representing order types can be encoded effectively with run length encoding due to the repetition of values. A column value runs table 1010 maps order type to a run length for the order type. While slight variations on the representation of the metadata of table 1010 are permitted, the basic idea is that run length encoding can give compression of ×50 for a run length of 100, which is superior to the gains bit packing can generally provide for the same data set.

Figure 11:
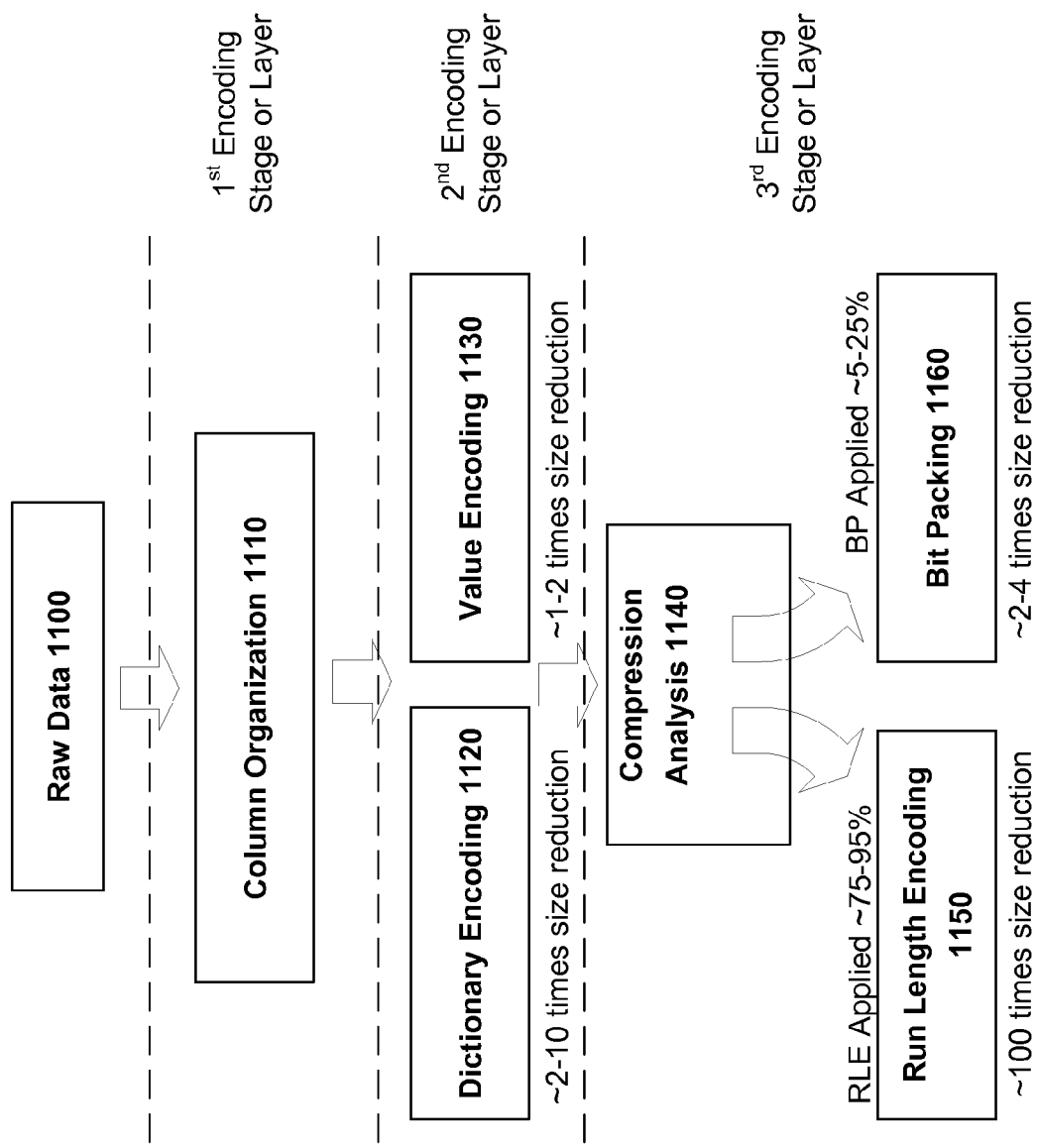
FIG. 11 is a block diagram illustrating an exemplary non-limiting implementation of encoding apparatus employing column based encoding techniques.

FIG. 11 is a general block diagram of an embodiment provided herein in which the techniques of FIGS. 7-10 are synthesized into various embodiments of a unified encoding and compression scheme. Raw data 1100 is organized as column streams according to column organization 1110. Dictionary encoding 1120 and/or value encoding 1130 provide respective size reductions as described above. Then, in a hybrid RLE and bit packing stage, a compression analysis 1140 examines potential bit savings across the columns when determining whether to apply run length encoding 1150 or bit packing 1160.

Figure 12:
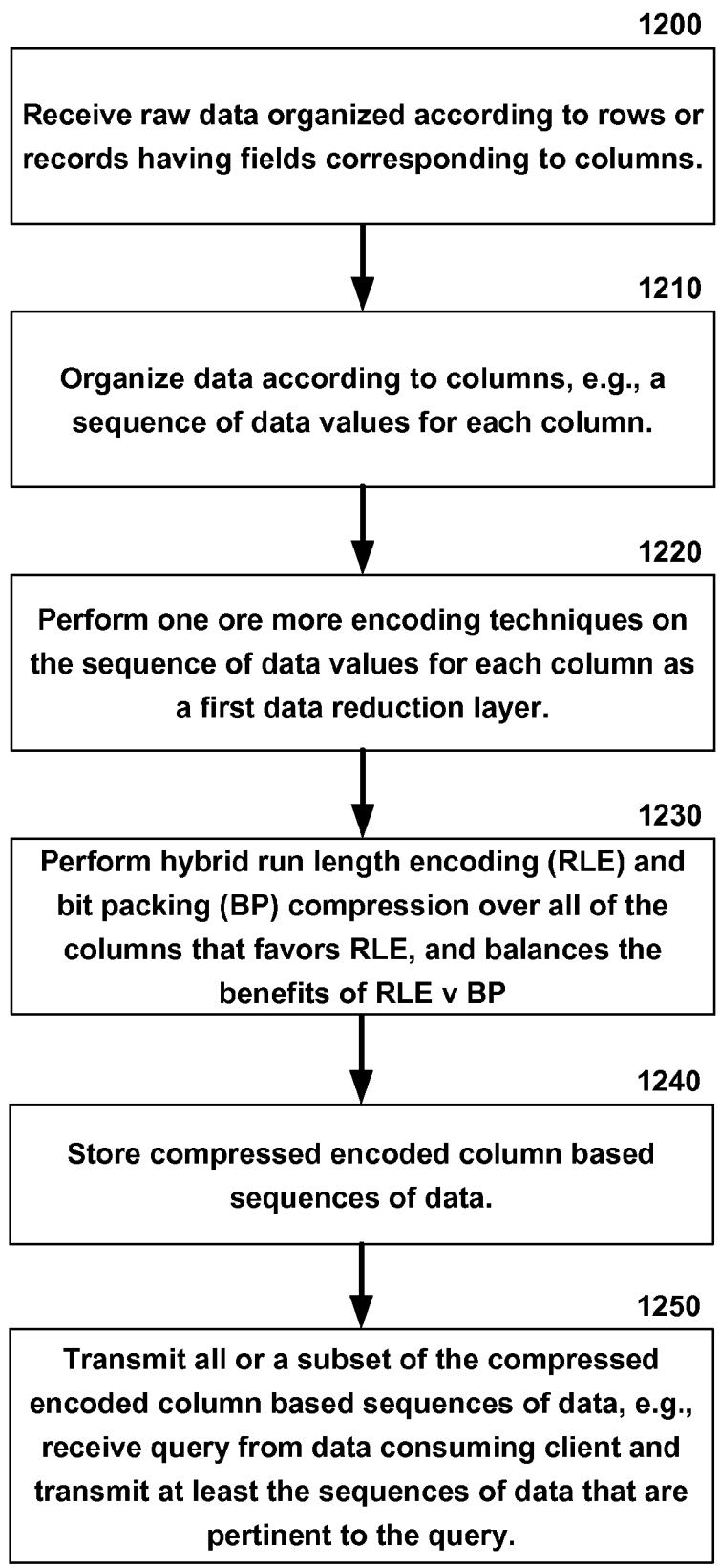
FIG. 12 is a flow diagram illustrating an exemplary non-limiting process for applying column based encoding to large scale data in accordance with an implementation.

FIG. 11 is expanded upon in the flow diagram of FIG. 12. At 1200, raw data is received according to an inherent row representation. At 1210, the data is re-organized as columns. At 1220, dictionary and/or value encoding are applied to reduce the data a first time. At 1230, a hybrid RLE and bit packing technique, as described above, can be applied. At 1240, the compressed and encoded column based sequence of data are stored. Then, when a client queries for all or a subset of the compressed encoded column based sequences of data, the affected columns are transmitted to the requesting client at 1250.

Figure 13:
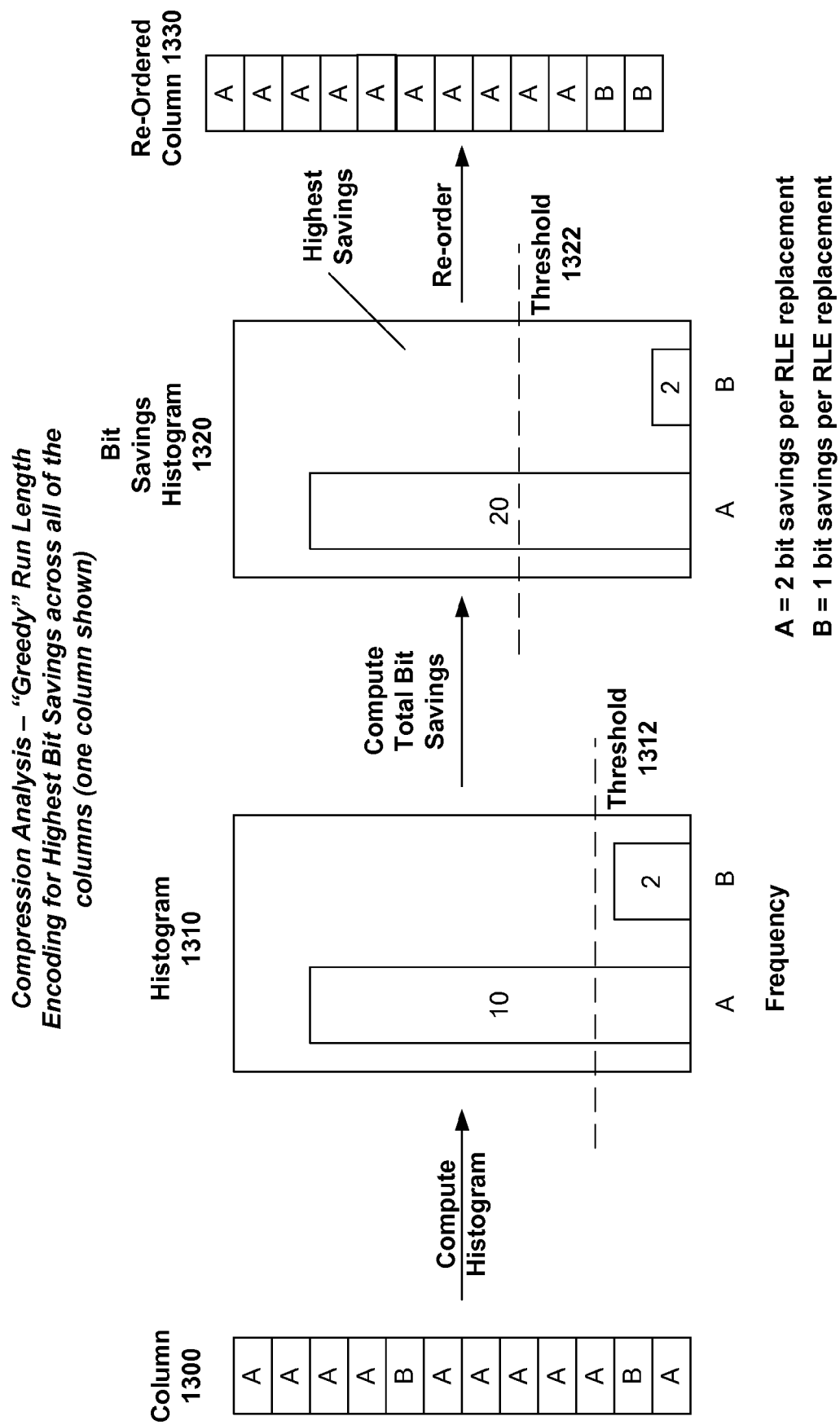
FIGS. 13-14 are exemplary illustrations of ways to perform a greedy run length encoding compression algorithm, including the optional application of a threshold savings algorithm for applying an alternative compression technique.

FIG. 13 is a block diagram of an exemplary way to perform the compression analysis of the hybrid compression technique. For instance, a histogram 1310 is computed from column 1300, which represents the frequency of occurrences of values, or the frequency of occurrences of individual run lengths. Optionally, a threshold 1312 can be set so that run length encoding does not apply for reoccurrences of a value that are small in number where run length gains may be minimal. Alternatively, or in addition, a bit savings histogram 1320 represents not only frequency of occurrences of values, but also the total bit savings that would be achieved by applying one or the other of the compression techniques of the hybrid compression model. In addition, a threshold 1322 can again be optionally applied to draw the line where run length encoding benefits are not significant enough to apply the technique. Instead, bit packing can be applied for those values of the column.

In addition, optionally, prior to applying run length encoding of the column 1300, the column 1300 can be re-ordered to group all of the most similar values as re-ordered column 1330. In this example, this means grouping the As together for a run length encoding and leaving the Bs for bit packing since neither the frequency nor the total bit savings justify run length encoding for the 2 B values. In this regard, the re-ordering can be applied to the other columns to keep the record data in lock step, or it can be remembered via column specific metadata how to undo the re-ordering of the run length encoding.

Figure 14:
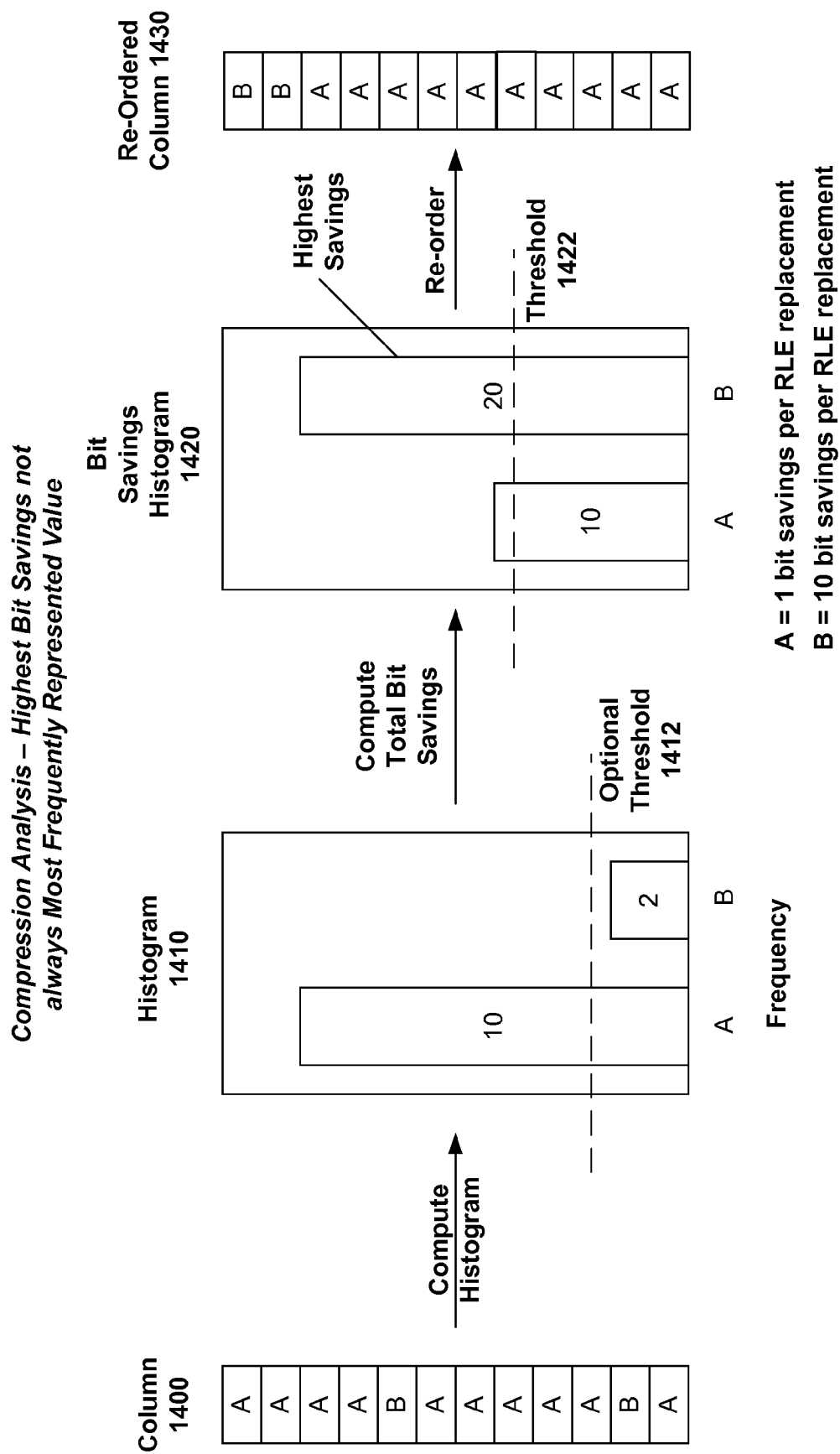

FIG. 14 illustrates a similar example where the compression analysis is applied to a similar column 1400, but where the bit savings per replacement of a run length have been altered so that now, it is justified according to the hybrid compression analysis to perform the run length encoding for the 2 B values, even before the 10 A values, since the 2 B values result in higher net bit savings. In this respect, much like a glutton choosing among 10 different plates with varying foods on them, application of run length encoding is "greedy" in that it iteratively seeks the highest gains in size reduction across all of the columns at each step. Similar to FIG. 13, a histogram of frequencies 1410 and/or a bit savings histogram 1420 data structure can be built to make determinations about whether to apply run length encoding, as described, or bit packing. Also, optional thresholds 1412 and 1422 can be used when deciding whether to pursue RLE or bit packing. Re-ordered column 1430 can help the run length encoding to define longer run lengths and thus achieve greater run length savings.

Figure 15:
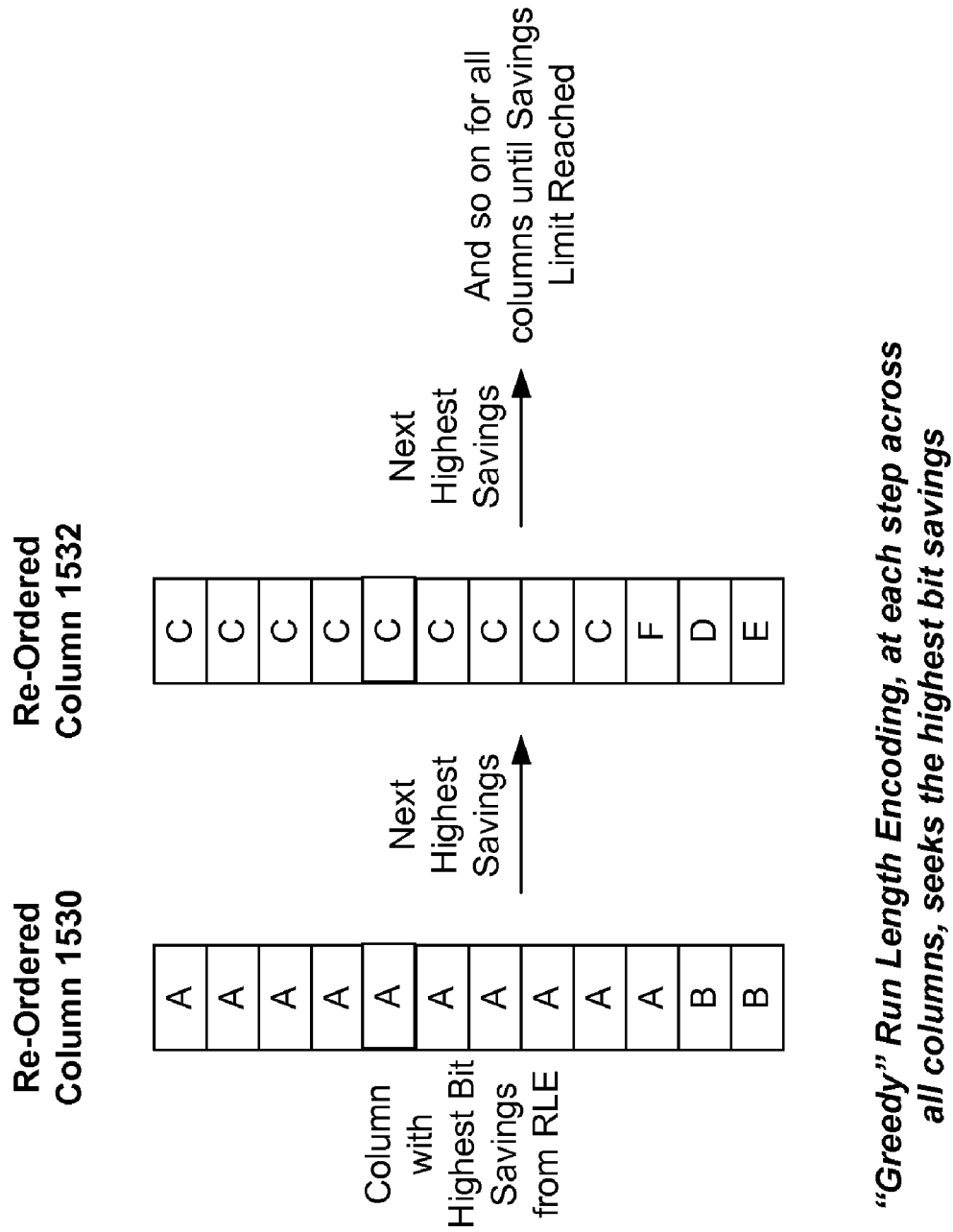
FIG. 15 is a block diagram further illustrating a greedy run length encoding compression algorithm.

FIG. 15 illustrates the "greedy" aspect of the run length encoding that examines, across all of the columns, where the highest bit savings are achieved at each step, and can optionally include re-ordering the columns as columns 1530, 1532, etc. to maximize run length savings. At a certain point, it may be that run length savings are relatively insignificant because the values are relatively unique at which point run length encoding is stopped.

Figure 16:
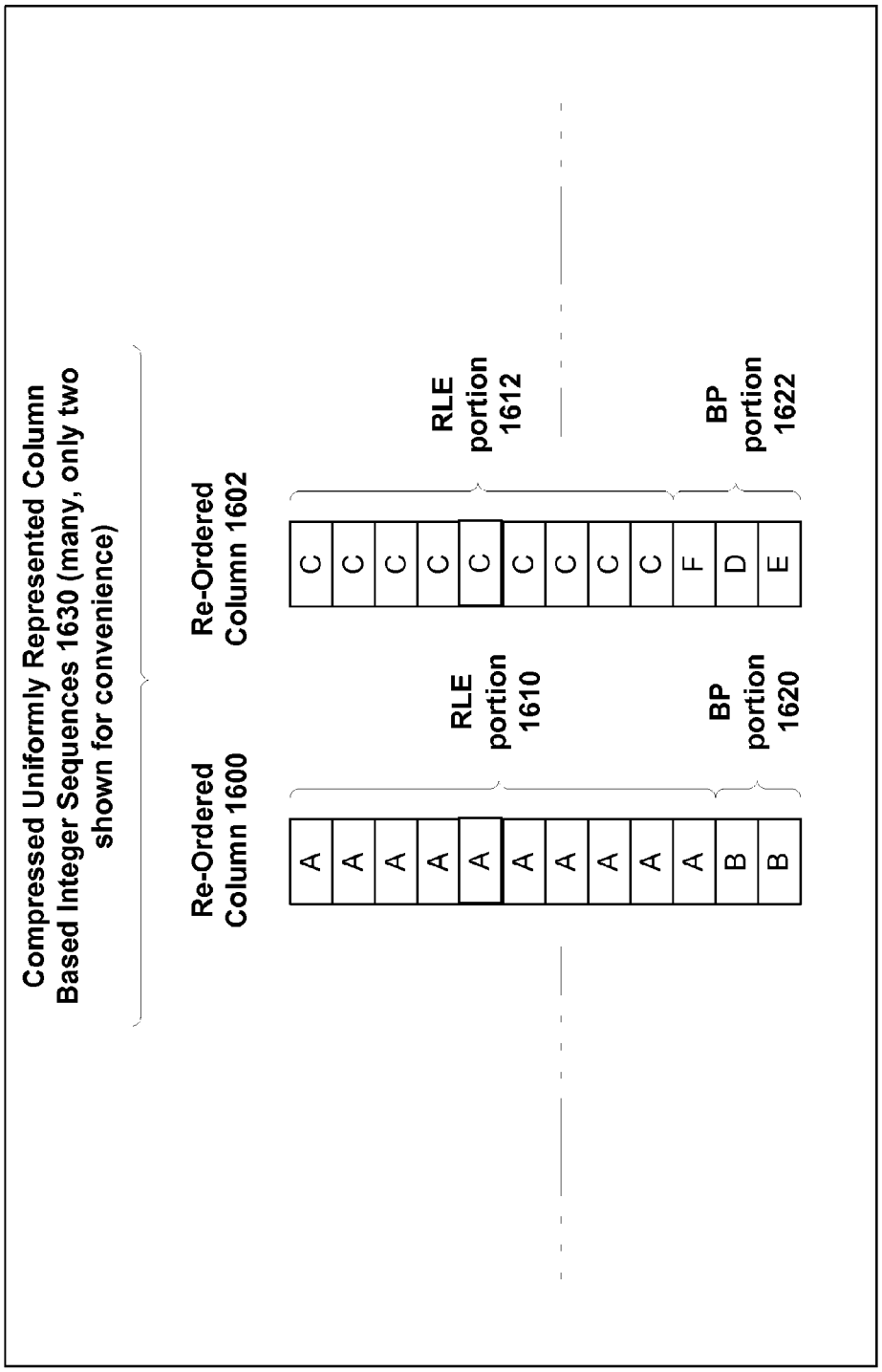
FIG. 16 is a block diagram illustrating a hybrid run length encoding and bit packing compression algorithm.

In the hybrid embodiment, bit packing is applied to the range of remaining values, which is illustrated in FIG. 16. In this regard, applying the hybrid compression technique, re-ordered column 1600 includes an RLE portion 1610 and a bit packing portion 1620 generally corresponding to recurring values and relatively unique values, respectively. Similarly, re-ordered column 1602 includes RLE portion 1612 and BP portion 1622.

Figure 17:
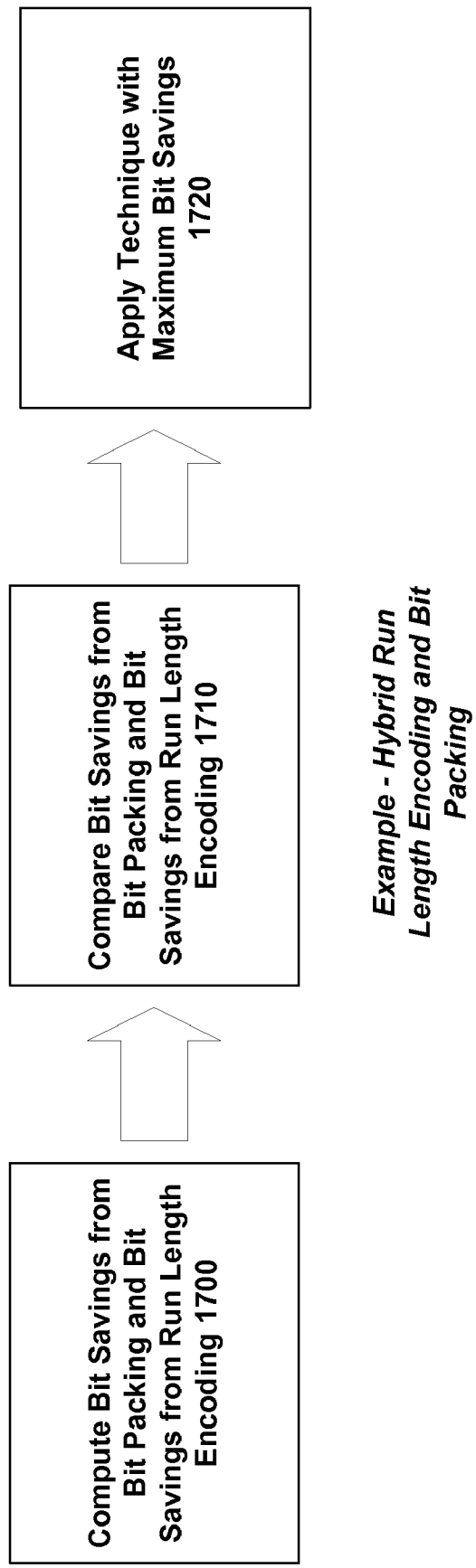
FIG. 17 is a flow diagram illustrating the application of a hybrid compression technique that adaptively provides different types of compression based on a total bit savings analysis.
Figure 18:
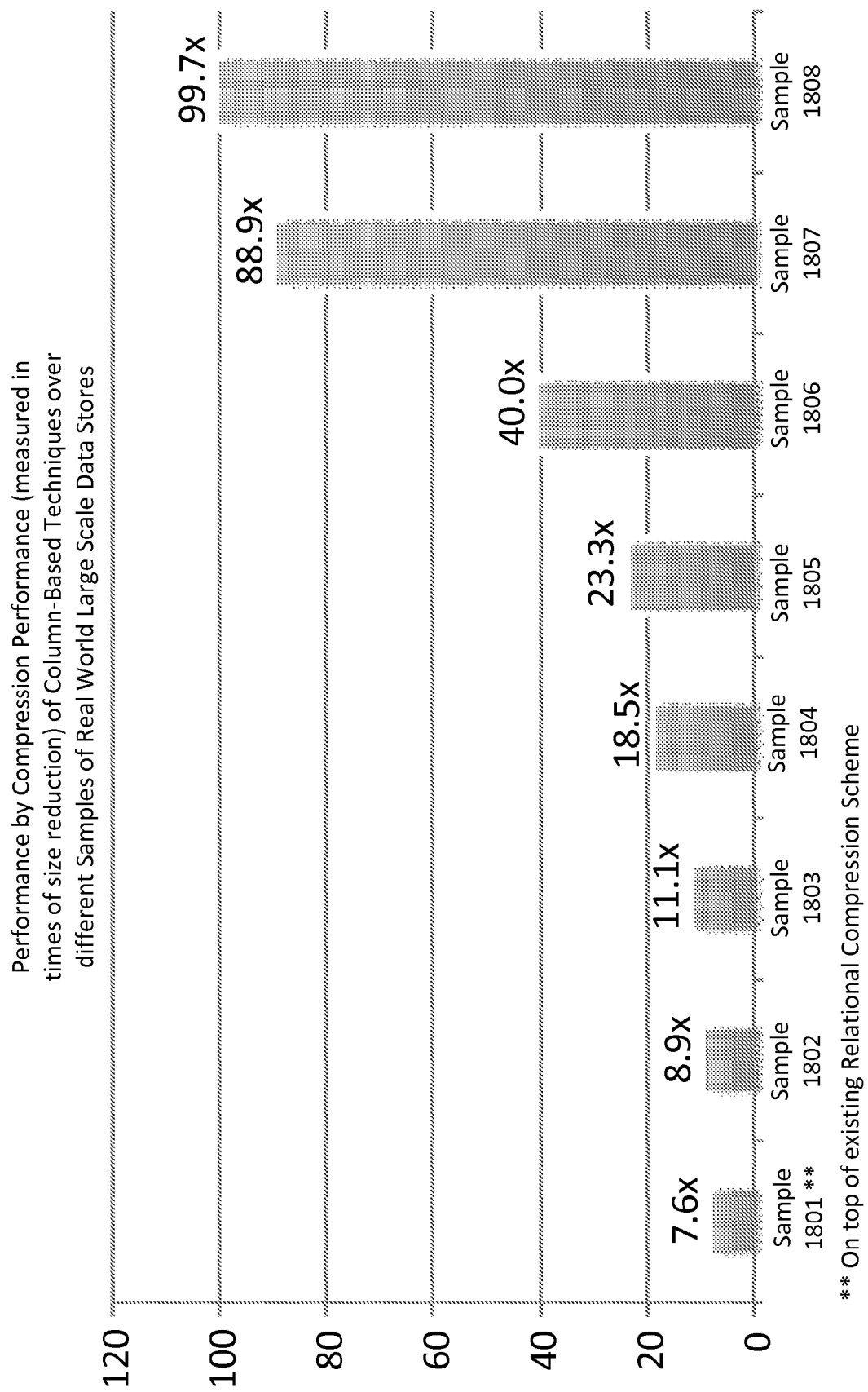
FIG. 18 block diagram illustrating the sample performance of the column based encoding to reduce an overall size of data in accordance with various embodiments of the subject disclosure.

In one embodiment shown in FIG. 17, the hybrid algorithm computes the bit savings from bit packing and bit savings from run length encoding 1700, and then the bit savings from bit packing and bit savings from run length are compared at 1710 or examined to determine which compression technique maximizes bit savings at 1720.

Exemplary performance of the above-described encoding and compression techniques illustrates the significant gains that can be achieved on real world data samples 1801, 1802, 1803, 1804, 1805, 1806, 1806, 1807 and 1808, ranging in performance improvement from about 9× to 99.7×, which depends on, among other things, the relative amounts of repetition of values in the particular large scale data sample.

Figure 19:
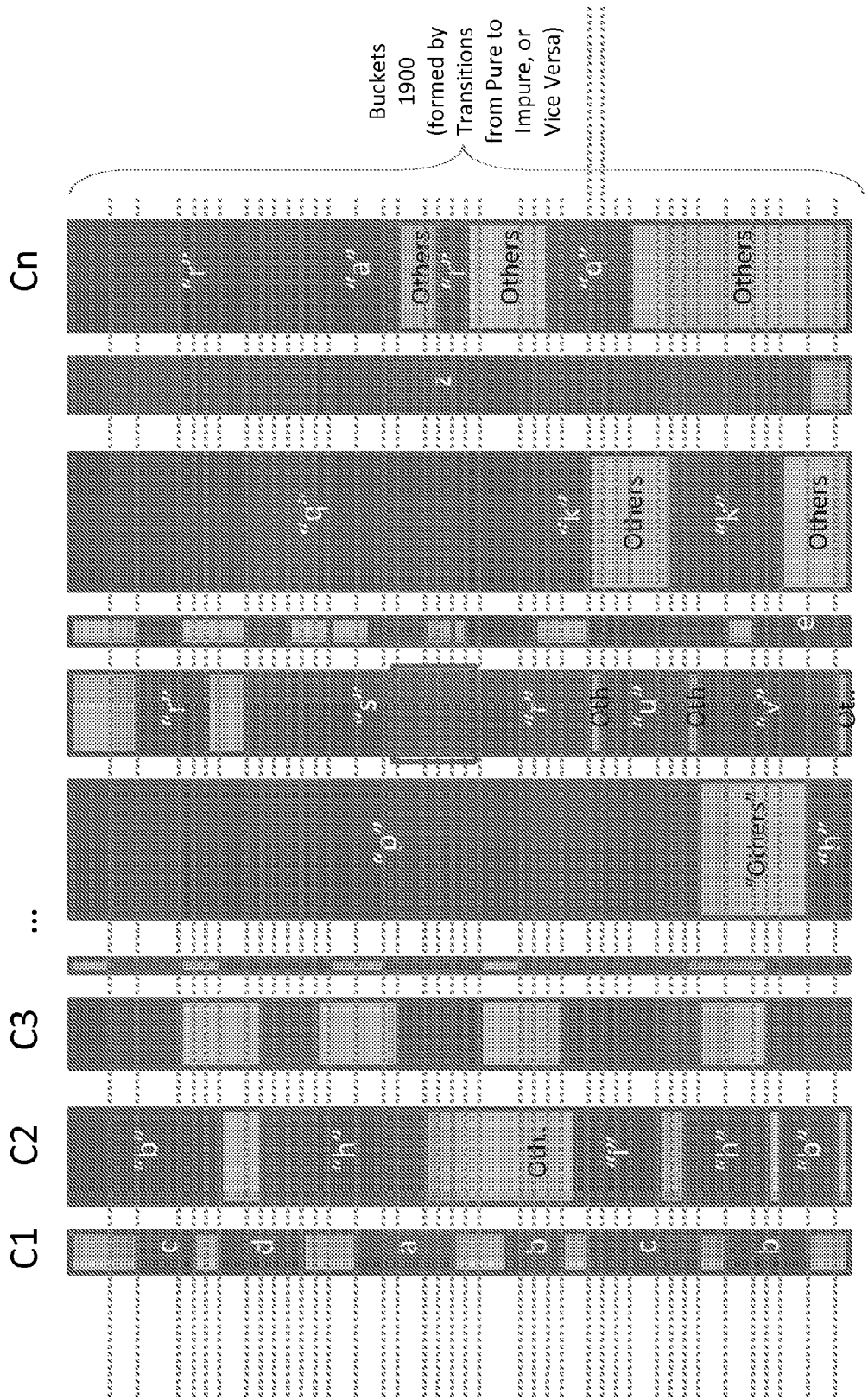
FIG. 19 illustrates a bucketization process that can be applied to column based encoded data with respect to transitions between pure and impure areas, and vice versa.

FIG. 19 is a block diagram showing the final result of the columnization, encoding and compression processes described herein in various embodiments. In this regard, each column C1, C2, C3, . . . , CN includes areas having homogeneous repeated values to which run length encoding has been applied, and other areas labeled "Others" or "Oth" in the diagram, which represent groups of heterogeneous values in the column. The areas with identical repeated values defined by run length are the pure areas 1920 and the areas having the variegated values are the impure areas 1910, as indicated in the legend. In this respect, as one's eye "walks down" the columns, a new view over the data emerges as an inherent benefit of the compression techniques discussed herein.

Across all of the columns, at the first transition point between an impure area 1910 and a pure area 1920, or the other way around, a bucket is defined as the rows from the first row to the row at the transition point. In this regard, buckets 1900 are defined down the columns at every transition point as shown by the dotted lines. Buckets 1900 are defined by the rows between the transitions.

FIG. 20 shows a nomenclature that is defined for the buckets based on the number of pure and impure areas across a particular row. A pure bucket 2000 is one with no impure areas. A single impurity bucket 2010 is one with 1 impure area across the rows of the bucket. A double impurity bucket 2010 is one with 2 impure area across the rows of the bucket. A triple impurity bucket has 3, and so on.

Thus, during an exemplary data load process, data is encoded, compressed and stored in a representation suitable for efficient querying later and a compression technique can be that used that looks for data distribution within a segment, and attempts to use RLE compression more often than bit packing. In this regard, RLE provides the following advantages for both compression and querying: (A) RLE typically requires significantly less storage than bit packing and (B) RLE includes the ability to effectively "fast forward" through ranges of data while performing such query building block operations as Group By, Filtering and/or Aggregations; such operations can be mathematically reduced to efficient operations over the data organized as columns.

In various non-limiting embodiments, instead of sorting one column segment at a time before sorting another column in the same segment, the compression algorithm clusters rows of data based on their distribution, and as such increases the use of RLE within a segment. Where used herein, the term "bucket" is used to describe clusters of rows, which, for the avoidance of doubt, should be considered distinct from the term "partition," a well defined online analytical processing (OLAP) and RDBMS concept.

The above discussed techniques are effective due to the recognition that data distribution is skewed, and that in large amounts of data, uniform distributions rarely exist. In compression parlance, Arithmetic Coding leverages this: by representing frequently used characters using fewer bits and infrequently used characters using more bits, with the goal of using fewer bits in total.

With bit packing, a fixed-sized data representation is utilized for faster random access. However, the compression techniques described herein also have the ability to use RLE, which provides a way to use fewer bits for more frequent values. For example, if an original table (including one column Col1 for simplicity of illustration) appeared as follows:

| Col1 |
| --- |
| 100 |
| 100 |
| 100 |
| 100 |
| 200 |
| 300 |
| 400 |

Then, after compression, Col1 appears as follows, divided into a first portion to which run length encoding is applied and a second portion to which bit packing applies:

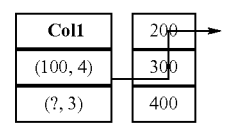

As can be seen above, occurrences of the most common value, 100, is collapsed into RLE, while the infrequently appearing values are still stored in a fixed-width, bit packed storage.

In this regard, the above-described embodiments of data packing includes two distinct phases: (1) Data analysis to determine bucketization, and (2) Reorganization of segment data to conform to the bucketized layout. Each of these are described in exemplary further detail below.

With respect to data analysis to determine bucketization, a goal is to cover as much data within a segment with RLE as possible. As such, this process is skewed towards favoring "thicker" columns, i.e., columns that have large cardinality, rather than columns that will be used more frequently during querying. Usage based optimizations can also be applied.

For another simple example, for the sake of illustration, the following small table is used. In reality, such small tables are not generally included within the scope of the above described compression because the benefit of compression of such tables tends not to be worthwhile. Also, such small tables are not generally included since compression occurs after encoding is performed, and works with data identifications (IDs) in one embodiment, not the values themselves. Thus, a Row # column is also added for illustration.

| Row # | Col1 (9 bits per value) | Col2 (11 bits per value) |
|---|---|---|
| 1 | 100 | 1231 |
| 2 | 100 | 12 |
| 3 | 200 | 1231 |
| 4 | 100 | 32 |
| 5 | 400 | 1231 |
| 6 | 100 | 111 |
| 7 | 100 | 12 |

Across the columns, the bucketization process begins by finding the single value the takes the most space in the segment data. As mentioned above in connection with FIGS. 13 and 14, this can be done using simple histogram statistics for each column, e.g., as follows.

| Column | Most Common Value | # occurrences | Space Saved |
|---|---|---|---|
| Col1 | 100 | 5 | 45 bits |
| Col2 | 1231 | 3 | 33 bits |

Once this value is selected, rows in the segment are logically reordered such that all occurrences of this value occur in a sequence, to maximize the length of an RLE run:

| Original Row # | Col1 | Col2 |
|---|---|---|
| 1 | 100 | 1231 |
| 2 |  | 12 |
| 4 |  | 32 |
| 6 |  | 111 |
| 7 |  | 12 |
| 3 | 200 | 1231 |
| 5 | 400 | 1231 |

In one embodiment, all values belonging to the same row exist at the same index in each of the column segment, e.g., col1[3] and col2[3] both belong to the third row. Ensuring this provides efficient random access to values in the same row, instead of incurring the cost of an indirection through a mapping table for each access. Therefore, in the presently described embodiment of the application of the greedy RLE algorithm, or the hybrid RLE and bit packing algorithm, when reordering a value in one column, this implies values in other column segments are reordered as well.

In the example above, two buckets now exist: {1,2,4,6,7} and {3,5}. As mentioned, the RLE applied herein is a greedy algorithm, which means that the algorithm follows the problem solving metaheuristic of making the locally optimum choice at each stage with the hope of finding the global optimum. After the first phase of finding the largest bucket, the next phase is to select the next largest bucket and repeat the process within that bucket.

| Original Row # | Col1 | Col2 |
|---|---|---|
| 2 | 100 | 12 |
| 7 |  |  |
| 1 |  | 1231 |
| 4 |  | 32 |
| 6 |  | 111 |
| 3 | 200 | 1231 |
| 5 | 400 | 1231 |

Now, there are three buckets: {2,7}, {1,4,6}, {3,5}, when the rows are re-organized accordingly. The largest bucket is the second one, but there are no repeating values there. The first bucket has all columns with RLE runs, and the rest of the values are unique, so it is known that there are no further RLE gains to be had in Col1. Taking the {3,5} bucket into account, there is another value, 1231, that can be converted to RLE. Interestingly, 1231 also appears on the previous bucket, and that bucket can be reordered such that 1231 is at the bottom, ready to be merged with the top of the next bucket. The next step results in the following:

| Original Row # | Col1 | Col2 |
|---|---|---|
| 2 | 100 | 12 |
| 7 |  |  |
| 6 |  | 111 |
| 4 |  | 32 |
| 1 |  | 1231 |
| 3 | 200 |  |
| 5 | 400 |  |

In the example above, four buckets now exist: {2,7}, {6,4}, {1}, {3,5}. Unable to reduce further the data further, the process moves to the next phase of reorganization of segment data.

While the illustration at the top reordered the rows as well, for performance reasons, the determination of the buckets can be based purely on statistics, from the act of reordering data within each column segment. The act of reordering data within each column segment can be parallelized based on available cores using a job scheduler.

As mentioned, the use of the above-described techniques is not practical for small datasets. For customer datasets, the above-described techniques frequently undergoes tens of thousands of steps, which can take time. Due to the greedy nature of the algorithm, the majority of space savings occur in the first few steps. In the first couple of thousand steps, most of the space that will be saved has already been saved. However, as will be observed on the scanning side of the compressed data, the existence of RLE in the packed columns gives significant performance boosts during querying, since even tiny compression gains reap rewards during querying.

Since one segment is processed at a time, multiple cores can be used, overlapping the time taken to read data from the data source into a segment with the time taken to compress the previous segment. With conventional technologies, at the rate of ~100K rows/sec reading from a relational database, a segment of 8M rows will take ~80 seconds, which is a significant amount of time available for such work. Optionally, in one embodiment, packing of the previous segment may also be stopped once data for the next segment is available.

Processing of the Column Based Data Encodings

As mentioned, the way that the data is organized according to the various embodiments for column based encoding lends itself to an efficient scan at the consuming side of the data, where the processing can be performed very fast on a select number of the columns in memory. The above-described data packing and compression techniques update the compression phase during row encoding, while scanning includes a query optimizer and processor to leverage the intelligent encoding.

The scan or query mechanism can be used to efficiently return results to business intelligence (BI) queries and is designed for the clustered layout produced by the above-described data packing and compression techniques, and optimizes for increased RLE usage, e.g., it is expected that during query processing, a significant number of columns used for querying would have been compressed using RLE. In addition, the fast scanning process introduces a column-oriented query engine, instead of a row-wise query processor over column stores. As such, even in buckets that contain bit pack data (as opposed to RLE data), the performance gains due to data locality can be significant.

In addition to introducing the above-described data packing and compression techniques and the efficient scanning, the following can be supported in a highly efficient manner: "OR" slices in queries and "Joins" between multiple tables where relationships have been specified.

As alluded to above, the scanning mechanism assumes segments contain buckets that span across a segment, and contains columns values in "pure" RLE runs or "impure" others bit pack storage, such as shown in FIG. 19.

In one embodiment, the scanning is invoked on a segment, the key being to work one bucket at a time. Within a bucket, the scanning process performs column-oriented processing in phases, depending on the query specification. The first phase is to gather statistics about what column areas are Pure, and what areas are Impure. Next, filters can be processed followed by processing of Group By operations, followed by processing of proxy columns. Next, aggregations can be processed as another phase.

As mentioned earlier, it is noted that the embodiments presented herein for the scanning implement column-oriented query processing, instead of row-oriented like conventional systems. Thus, for each of these phases, the actual code executed can be specific to: (1) whether the column being operated on is run length encoded or not, (2) the compression type used for bit packing, (3) whether results will be sparse or dense, etc. For Aggregations, additional considerations are taken into account: (1) encoding type (hash or value), (2) aggregation function (sum/min/max/count), etc.

Figure 21:
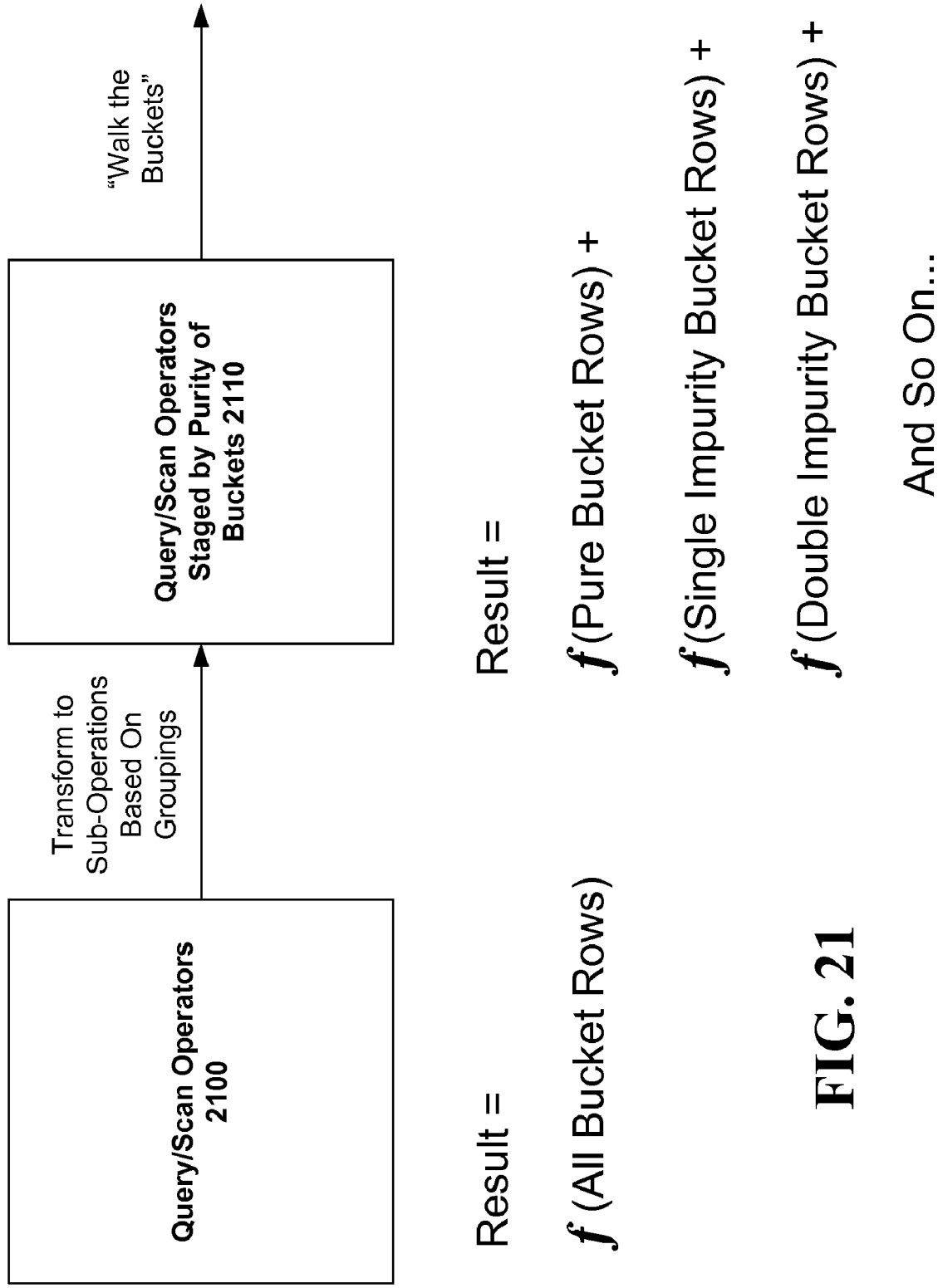
FIG. 21 illustrates the efficient division of query/scan operators into sub-operators corresponding to the different types of buckets present in the columns relevant to the current query/scan.
Figure 22:
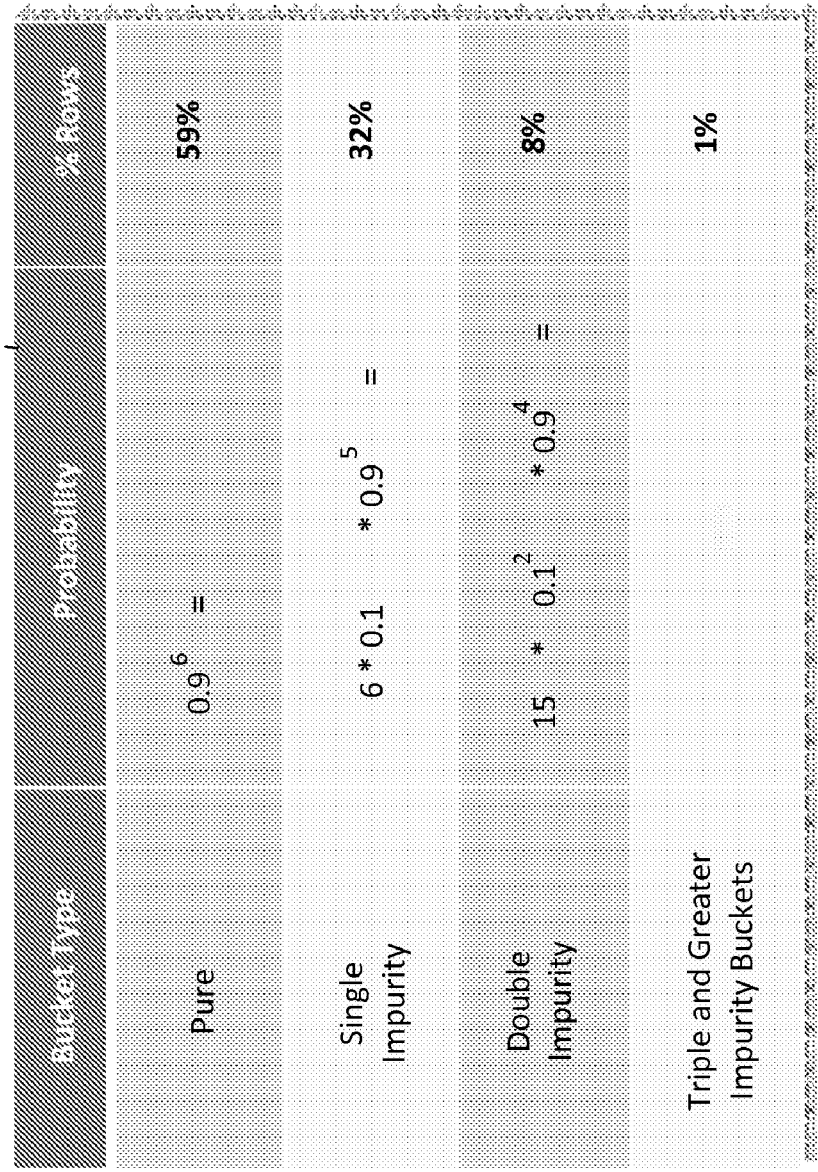
FIG. 22 illustrates the power of column based encoding where resulting pure buckets represent more than 50% of the rows of the data.

In general, the scanning process thus follows the form of FIG. 21 in which a query result from various standard query/scan operators 2100 is a function of all of the bucket rows. The query/scan operators 2100 can be broken up mathematically in effect such that the filters, Group Bys, proxy columns, and aggregations are processed separate from one another in phases.

In this regard, for each of the processing steps, the operators are processed according to different purities of the buckets at 2110 according to a bucket walking process. Consequently, instead of a generalized and expensive scan of all the bucket rows, with the specialization of different buckets introduced by the work of the encoding and compression algorithms described herein, the result is thus an aggregated result of the processing of pure buckets, single impurity buckets, double impurity buckets, etc.

Figure 24:
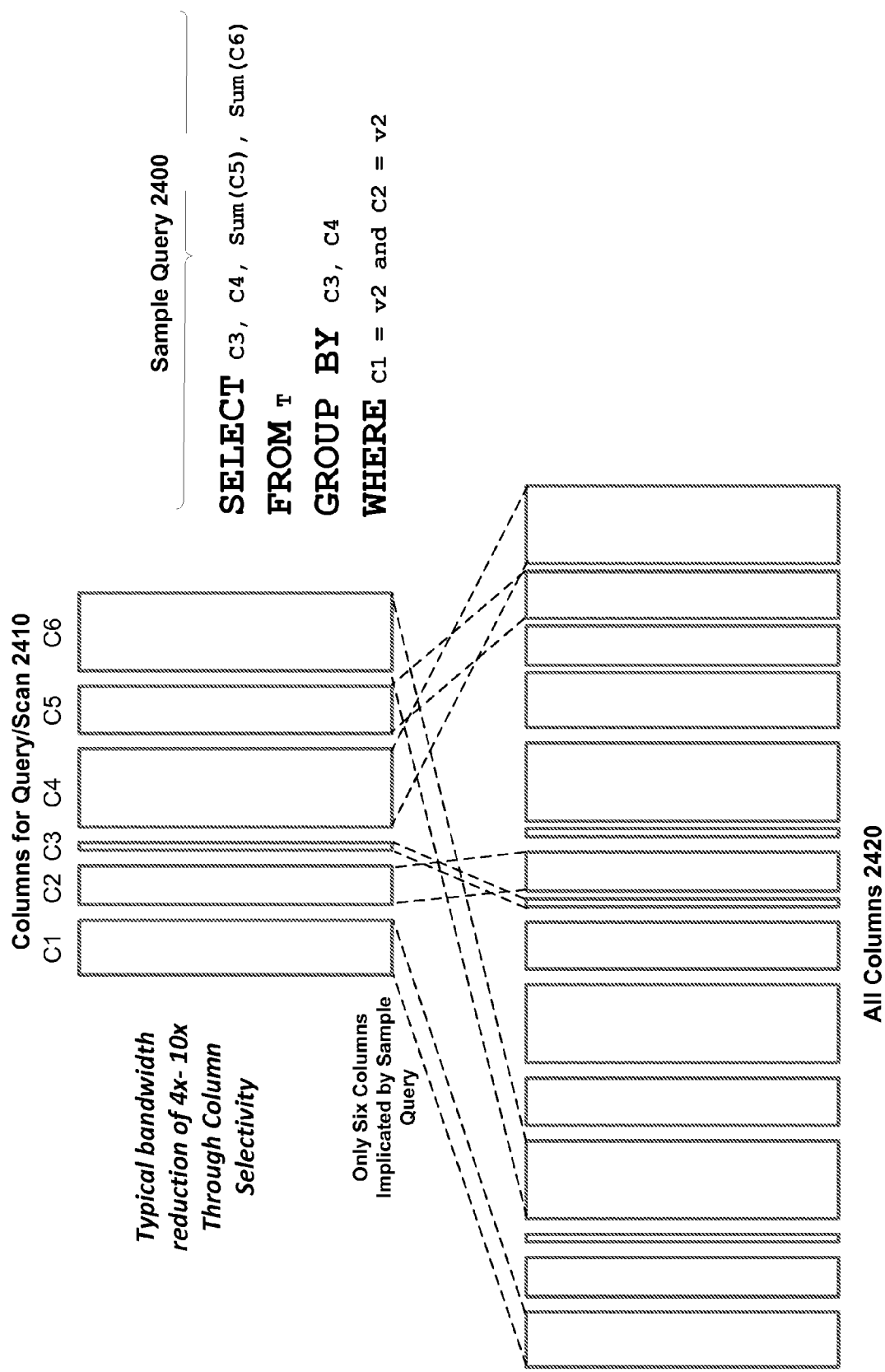
FIG. 24 illustrates representative processing of a sample query requested by a consuming client device over large scale data available via a network.

FIG. 24 shows a sample distribution of buckets and the power of the compression architecture, since processing performed over pure buckets is the fastest due to the reduction of processing mathematics to simple operations, followed by the second fastest being the single impurity buckets, and so on for additional impurity buckets. Moreover, it has been found that a surprisingly large number of buckets are pure. For instance, as shown in FIG. 25, for six columns implicated by a query, if each column has about 90% purity (meaning about 90% of the values are represented with run length encoding due to similar data), then about 60% of the buckets will be pure, about $\frac{1}{3}$ will be single impurity, about 8% will be double purity, and the rest will be accounted for at a mere 1%. Since processing of pure buckets is the fastest, and processing of single impurity and double impurity buckets is still quite fast, the "more complex" processing of buckets with 3 or more impure areas is kept to a minimum.

FIG. 23 indicates a sample query 2300 with some sample standard query building blocks, such as sample "filter by column" query building block 2302, sample "Group by Column" query building block 2304 and sample "Aggregate by Column" query building block 2306.

FIG. 24 is a block diagram illustrating an additional aspect of bandwidth reduction through column selectivity. Reviewing sample query 2400, one can see that no more than 6 columns 2410 of all columns 2420 are implicated, and thus only six columns need be loaded into local RAM for a highly efficient query.

Various embodiments have thus been described herein. FIG. 25 illustrates an embodiment for encoding data, including organizing the data according to a set of column based sequences of values corresponding to different data fields of the data at 2500. Then, at 2510, the set of column based sequences of values are transformed to a set of column based integer sequences of values according to at least one encoding algorithm, such as dictionary encoding and/or value encoding. Then, at 2520, the set of column based integer sequences are compressed according to at least one compression algorithm, including a greedy run length encoding algorithm applied across the set of column based integer sequences or a bit backing algorithm, or a combination of run length encoding and bit packing.

In one embodiment, the integer sequences are analyzed to determine whether to apply run length encoding (RLE) compression or bit packing compression including analyzing bit savings of RLE compression relative to bit packing compression to determine where the maximum bit savings is achieved. The process can include generating a histogram to assist in determining where the maximum bit savings are achieved.

Figure 26:
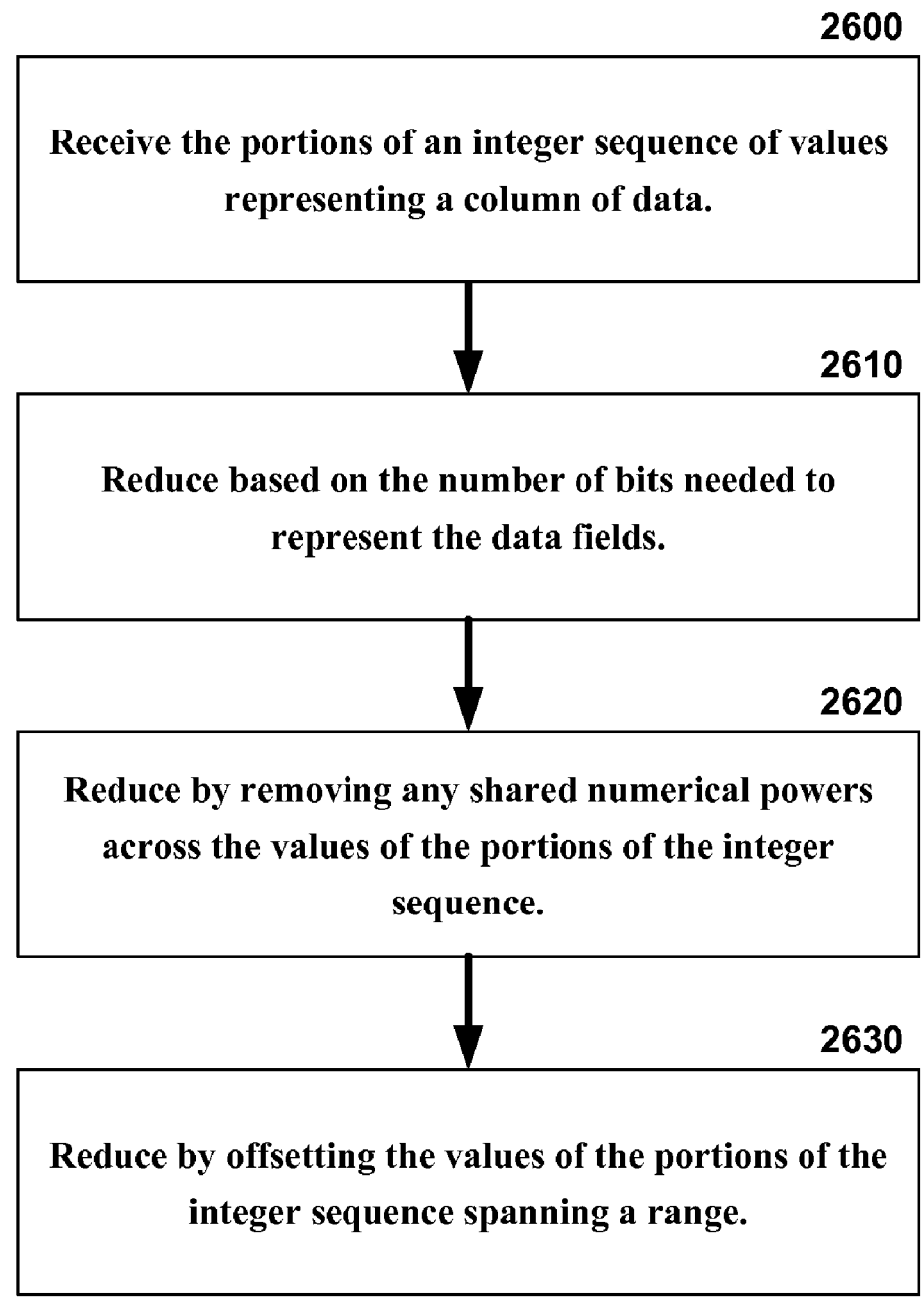
FIG. 26 is a flow diagram illustrating a process for bit packing integer sequences according to one or more embodiments.

In another embodiment, as shown in FIG. 26, a bit packing technique includes receiving, at 2600, the portions of an integer sequence of values representing a column of data, and three stages of potential reduction by bit packing. At 2610, the data can be reduced based on the number of bits needed to represent the data fields. At 2620, the data can be reduced by removing any shared numerical powers across the values of the portions of the integer sequence. At 2630, the data can also be reduced by offsetting the values of the portions of the integer sequence spanning a range.

In another embodiment, as shown in the flow diagram of FIG. 27, in response to a query, at 2700, a subset of the data is retrieved as integer encoded and compressed sequences of values corresponding to different columns of the data. Then, at 2710, processing buckets are defined that span over the subset of the data based on changes of compression type occurring in any of the integer encoded and compressed sequences of values of the subset of data. Next, at 2720, query operations are performed based on type of current bucket being processed for efficient query processing. The operations can be performed in memory, and parallelized in a multi-core architecture.

Different buckets include where (1) the different portions of values in the bucket across the sequences are all compressed according to run length encoding compression, defining a pure bucket, (2) all but one portion compressed according to run length encoding, defining a single impurity bucket, or (3) all but two portions compressed according to run length encoding, defining a double impurity bucket.

The improved scanning enables performing a variety of standard query and scan operators much more efficiently, particularly for the purest buckets. For instance, logical OR query slice operations, query join operations between multiple tables where relationships have been specified, filter operations, Group By operations, proxy column operations or aggregation operations can all be performed more efficiently when the bucket walking technique is applied and processing is performed based on bucket type.

Exemplary Networked and Distributed Environments

One of ordinary skill in the art can appreciate that the various embodiments of column based encoding and query processing described herein can be implemented in connection with any computer or other client or server device, which can be deployed as part of a computer network or in a distributed computing environment, and can be connected to any kind of data store. In this regard, the various embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may cooperate to perform one or more aspects of any of the various embodiments of the subject disclosure.

Figure 28:
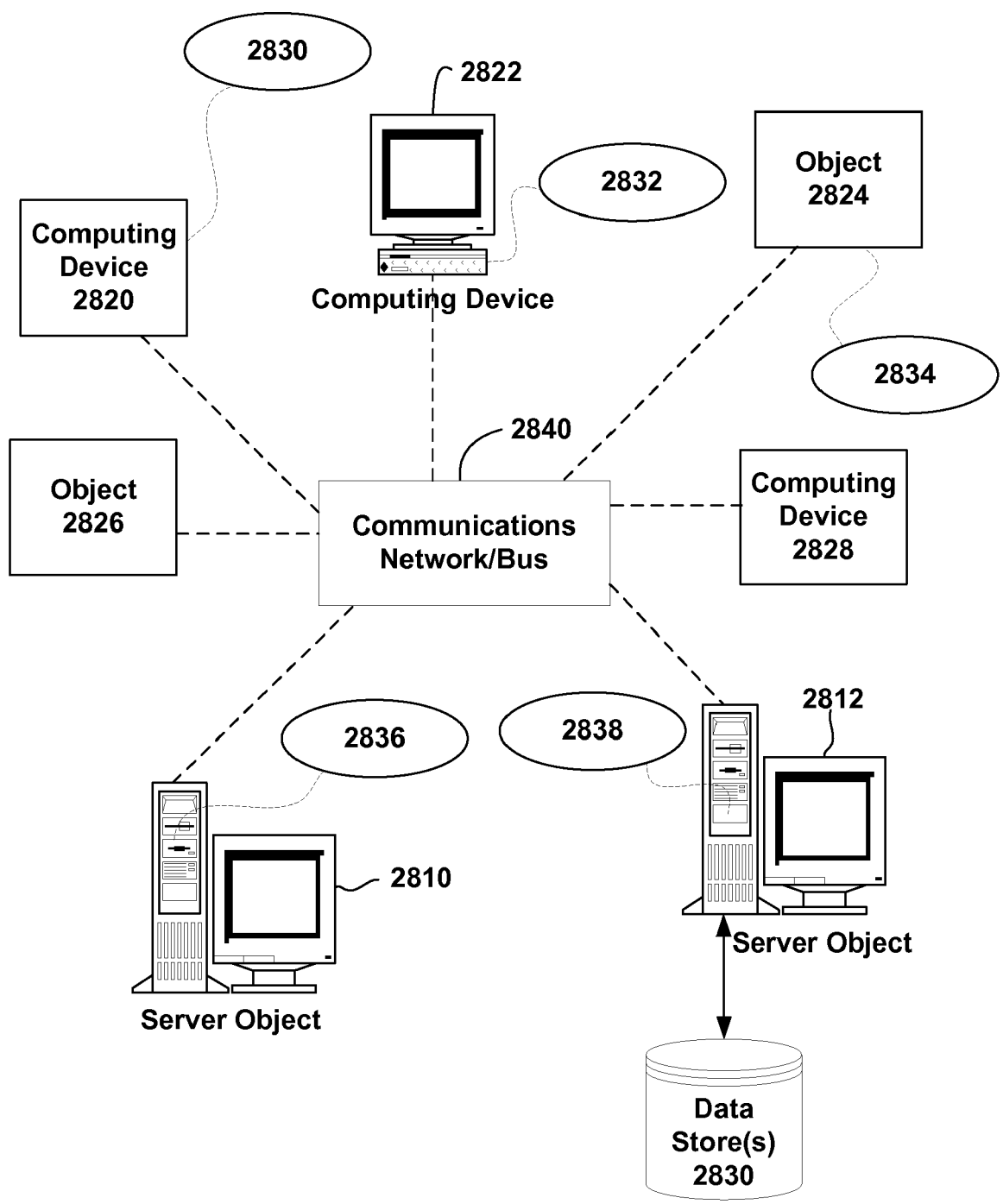
FIG. 28 is a block diagram representing exemplary non-limiting networked environments in which various embodiments described herein can be implemented.

FIG. 28 provides a schematic diagram of an exemplary networked or distributed computing environment. The distributed computing environment comprises computing objects 2810, 2812, etc. and computing objects or devices 2820, 2822, 2824, 2826, 2828, etc., which may include programs, methods, data stores, programmable logic, etc., as represented by applications 2830, 2832, 2834, 2836, 2838. It can be appreciated that objects 2810, 2812, etc. and computing objects or devices 2820, 2822, 2824, 2826, 2828, etc. may comprise different devices, such as PDAs, audio/video devices, mobile phones, MP3 players, personal computers, laptops, etc.

Each object 2810, 2812, etc. and computing objects or devices 2820, 2822, 2824, 2826, 2828, etc. can communicate with one or more other objects 2810, 2812, etc. and computing objects or devices 2820, 2822, 2824, 2826, 2828, etc. by way of the communications network 2840, either directly or indirectly. Even though illustrated as a single element in FIG. 28, network 2840 may comprise other computing objects and computing devices that provide services to the system of FIG. 28, and/or may represent multiple interconnected networks, which are not shown. Each object 2810, 2812, etc. or 2820, 2822, 2824, 2826, 2828, etc. can also contain an application, such as applications 2830, 2832, 2834, 2836, 2838, that might make use of an API, or other object, software, firmware and/or hardware, suitable for communication with, processing for, or implementation of the column based encoding and query processing provided in accordance with various embodiments of the subject disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the column based encoding and query processing as described in various embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service without having to "know" any working details about the other program or the service itself.

In a client/server architecture, particularly a networked system, a client is usually a computer that accesses shared network resources provided by another computer, e.g., a server. In the illustration of FIG. 28, as a non-limiting example, computers 2820, 2822, 2824, 2826, 2828, etc. can be thought of as clients and computers 2810, 2812, etc. can be thought of as servers where servers 2810, 2812, etc. provide data services, such as receiving data from client computers 2820, 2822, 2824, 2826, 2828, etc., storing of data, processing of data, transmitting data to client computers 2820, 2822, 2824, 2826, 2828, etc., although any computer can be considered a client, a server, or both, depending on the circumstances. Any of these computing devices may be processing data, encoding data, querying data or requesting services or tasks that may implicate the column based encoding and query processing as described herein for one or more embodiments.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the column based encoding and query processing can be provided standalone, or distributed across multiple computing devices or objects.

In a network environment in which the communications network/bus 2840 is the Internet, for example, the servers 2810, 2812, etc. can be Web servers with which the clients 2820, 2822, 2824, 2826, 2828, etc. communicate via any of a number of known protocols, such as the hypertext transfer protocol (HTTP). Servers 2810, 2812, etc. may also serve as clients 2820, 2822, 2824, 2826, 2828, etc., as may be characteristic of a distributed computing environment.

Exemplary Computing Device

As mentioned, advantageously, the techniques described herein can be applied to any device where it is desirable to query large amounts of data quickly. It should be understood, therefore, that handheld, portable and other computing devices and computing objects of all kinds are contemplated for use in connection with the various embodiments, i.e., anywhere that a device may wish to scan or process huge amounts of data for fast and efficient results. Accordingly, the below general purpose remote computer described below in FIG. 29 is but one example of a computing device.

Although not required, embodiments can partly be implemented via an operating system, for use by a developer of services for a device or object, and/or included within application software that operates to perform one or more functional aspects of the various embodiments described herein. Software may be described in the general context of computer-executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol should be considered limiting.

Figure 29:
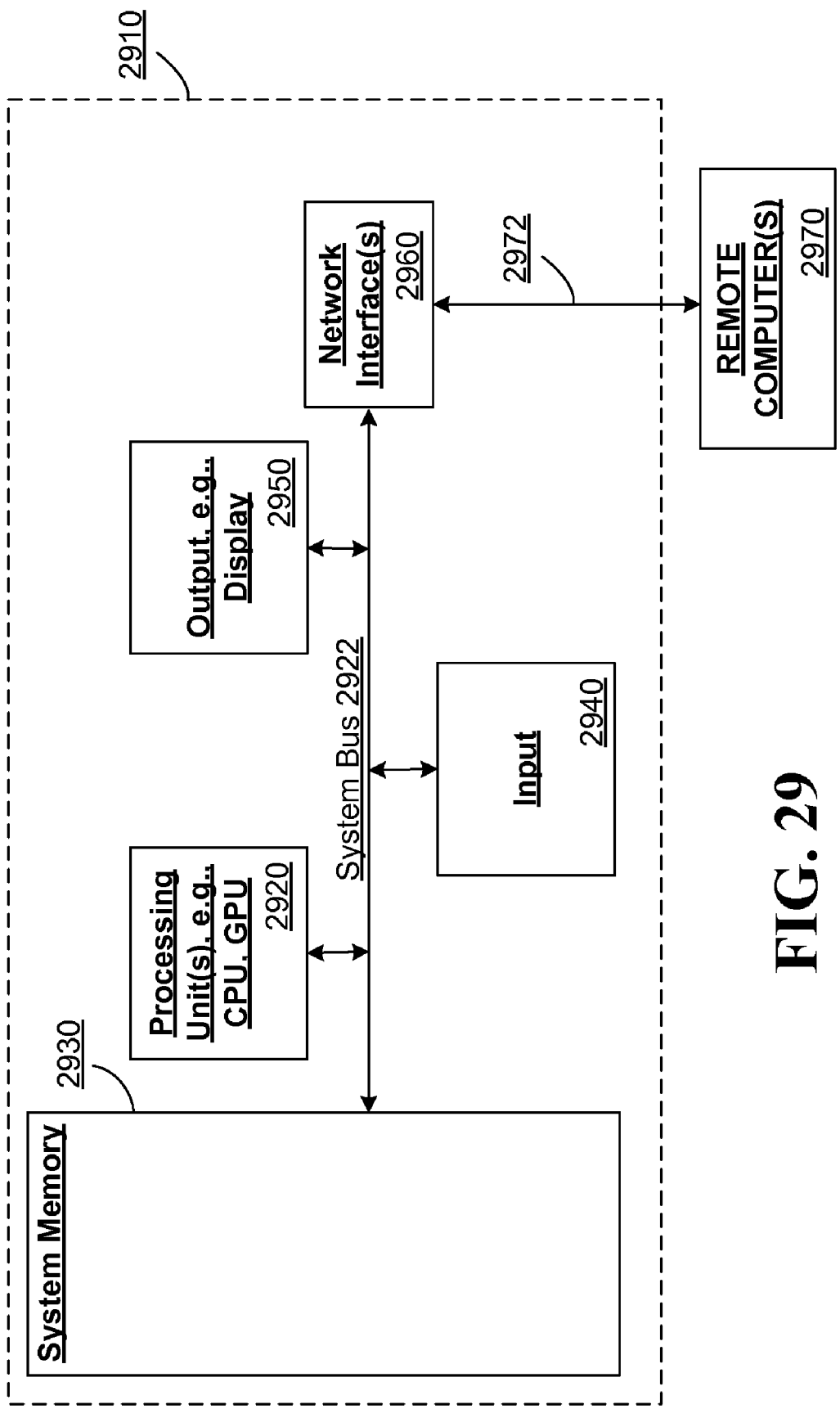
FIG. 29 is a block diagram representing an exemplary non-limiting computing system or operating environment in which one or more aspects of various embodiments described herein can be implemented.

FIG. 29 thus illustrates an example of a suitable computing system environment 2900 in which one or aspects of the embodiments described herein can be implemented, although as made clear above, the computing system environment 2900 is only one example of a suitable computing environment and is not intended to suggest any limitation as to scope of use or functionality. Neither should the computing environment 2900 be interpreted as having any dependency or requirement relating to any one or combination of components illustrated in the exemplary operating environment 2900.

With reference to FIG. 29, an exemplary remote device for implementing one or more embodiments includes a general purpose computing device in the form of a computer 2910. Components of computer 2910 may include, but are not limited to, a processing unit 2920, a system memory 2930, and a system bus 2922 that couples various system components including the system memory to the processing unit 2920.

Computer 2910 typically includes a variety of computer readable media and can be any available media that can be accessed by computer 2910. The system memory 2930 may include computer storage media in the form of volatile and/or nonvolatile memory such as read only memory (ROM) and/or random access memory (RAM). By way of example, and not limitation, memory 2930 may also include an operating system, application programs, other program modules, and program data.

A user can enter commands and information into the computer 2910 through input devices 2940. A monitor or other type of display device is also connected to the system bus 2922 via an interface, such as output interface 2950. In addition to a monitor, computers can also include other peripheral output devices such as speakers and a printer, which may be connected through output interface 2950.

The computer 2910 may operate in a networked or distributed environment using logical connections to one or more other remote computers, such as remote computer 2970. The remote computer 2970 may be a personal computer, a server, a router, a network PC, a peer device or other common network node, or any other remote media consumption or transmission device, and may include any or all of the elements described above relative to the computer 2910. The logical connections depicted in FIG. 29 include a network 2972, such local area network (LAN) or a wide area network (WAN), but may also include other networks/buses. Such networking environments are commonplace in homes, offices, enterprise-wide computer networks, intranets and the Internet.

As mentioned above, while exemplary embodiments have been described in connection with various computing devices and network architectures, the underlying concepts may be applied to any network system and any computing device or system in which it is desirable to compress large scale data or process queries over large scale data.

Also, there are multiple ways to implement the same or similar functionality, e.g., an appropriate API, tool kit, driver code, operating system, control, standalone or downloadable software object, etc. which enables applications and services to use the efficient encoding and querying techniques. Thus, embodiments herein are contemplated from the standpoint of an API (or other software object), as well as from a software or hardware object that provides column based encoding and/or query processing. Thus, various embodiments described herein can have aspects that are wholly in hardware, partly in hardware and partly in software, as well as in software.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

As mentioned, the various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the described subject matter will be better appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention should not be limited to any single embodiment, but rather should be construed in breadth, spirit and scope in accordance with the appended claims.

What is claimed is:

1. A computer-implemented method for encoding data to simultaneously compact and organize the data in a manner that facilitates efficient data access operations, including:
    an act of a computer system, which includes at least one processing unit, organizing the data according to a set of column based sequences of values corresponding to different data fields of the data;
    an act of the computer system transforming the set of column based sequences of values to a set of column based integer sequences of values according to at least one encoding algorithm; and
    an act of the computer system compressing the set of column based integer sequences according to an iterative hybrid compression algorithm, the iterative hybrid compression algorithm comprising, in at least one iterative encoding step:
        an act of analyzing the set of column based integer sequences to determine which encoding technique to apply to compress the set of column based integer sequences, the encoding technique comprising at least one of:
            a run length encoding (RLE) technique that replaces one or more sequences of a same data value with a single data value and a count of the number of times the data value appears in each sequence, or
            a bit packing encoding technique that minimizes a number of bits used to represent each value in a set values, by determining a numeric range over which the set of values span and applying one or more optimizations, including one or more of: (i) eliminating any bits not needed to represent numbers within the numeric range, (ii) removing common powers, or (iii) shifting the set of values,
        the act of analyzing including comparing a first computed bit savings of applying the RLE technique against a second computed bit savings of applying the bit packing encoding technique; and
        an act of applying the RLE technique or the bit packing encoding technique on at least a portion of the set of column based integer sequences, based on the analysis.

2. The method of claim 1, wherein the transforming includes encoding the set of column based sequences via a dictionary encoding algorithm that maps data fields to integer values.

3. The method of claim 1, wherein the transforming includes encoding the set of column based sequences via a value encoding algorithm that applies an invertible mathematical function to the data fields to use fewer bits to represent the data fields.

4. The method of claim 1, wherein the compressing includes compressing with a greedy RLE technique that, at each iterative encoding step, applies to a portion of the set of column based integer sequences where the maximum bit savings are achieved.

5. The method of claim 4, wherein the compressing includes generating a histogram to assist in determining where the maximum bit savings are achieved.

6. The method of claim 1, wherein the compressing includes compressing the set of column based integer sequences according to at least one greedy compression algorithm that seeks to maximize bit savings at each step of the compression.

7. The method of claim 1, wherein the iterative hybrid compression algorithm compresses at least a first portion of one of the column based integer sequences using the RLE technique and wherein the iterative hybrid compression algorithm compresses at least a second portion of the one of the column based integer sequences using the bit packing encoding technique.

8. The method of claim 7, wherein the iterative hybrid compression algorithm rearranges the integer sequences of the one of the column based integer sequences to facilitate compressing the first portion using the RLE technique and compressing the second portion using the bit packing encoding technique.

9. The method of claim 8, wherein rearranging the integer sequences comprises rearranging the integer sequences of the one of the column based integer sequences only.

10. The method of claim 8, wherein rearranging the integer sequences comprises rearranging integer sequences of each sequence in the set of the column based integer sequences to keep the data in lock step across the set of the column based integer sequences.

11. One or more physical storage media storing computer-executable instructions that, when executed by one or more processing units of a computer system, implement a plurality of components of an encoder that simultaneously compacts and organizes data in a manner that facilitates efficient data access operations, including:
    an organization component that organizes raw data received as a set of serialized values corresponding to different fields or columns of the raw data to form columnized sequences of data;

a data encoding component that performs at least one of dictionary encoding or value encoding to uniformly represent the columnized sequences of data as integer sequences; and a compression component that uses an iterative hybrid compression algorithm to determine on which portion of the integer sequences to perform compression next and what encoding technique to use to compress the portion of the integer sequences, the encoding technique selected from among:

a run length encoding (RLE) technique that represents a repeated sequence of a same data value with a single data value and a count of the number of times the data value appears in the sequence, or a bit packing encoding technique that minimizes a number of bits used to represent each value in a set of values, by determining a numeric range over which the set of values span and applying one or more optimizations, including one or more of: eliminating any bits not needed to represent numbers within the numeric range, removing common powers, or shifting the set of values, the compression component selecting and applying at least one of RLE or bit packing to the portion of the integer sequences based on comparing a first computed bit savings of applying RLE to the portion of the integer sequences against a second computed bit savings of applying bit packing to the portion of the integer sequences.

12. The physical storage media of claim 11, wherein the compression component re-orders the columns when performing RLE.

13. The physical storage media of claim 11, wherein the data encoding component that performs value encoding at least one of reduces the integer sequences by eliminating repeated numbers in each data field or reduces the integer sequences by transforming float values to integer values via a mathematical function.

14. A computer system, comprising:
at least one processing unit; and
one or more storage media having stored thereon executable instructions that, when executed by the at least one processing unit, carry out a method, comprising:

an act of organizing the data according to a set of column based sequences of values corresponding to different data fields of the data;

an act of transforming the set of column based sequences of values to a set of column based integer sequences of values according to at least one encoding algorithm; and an act of compressing the set of column based integer sequences according to an iterative hybrid compression algorithm, the iterative hybrid compression algorithm comprising, in at least one iterative encoding step:

calculating which encoding technique to apply to the set of column based integer sequences in order to compress the set of column based integer sequences, the encoding technique selected from among a run length encoding (RLE) technique and a bit packing encoding technique, the calculating including evaluating a first computed bit savings of applying the RLE technique against a second computed bit savings of applying the bit packing encoding technique, wherein the RLE technique replaces one or more sequences of a same data value with a single data value and a count of the number of times the data value appears in each sequence, and wherein the bit packing encoding technique minimizes a number of bits used to represent each value in a set values by determining a range over which the set of values span and applying one or more of: eliminating any bits not needed to represent numbers within the range, removing common powers, or shifting the set of values; and applying the RLE technique or the bit packing encoding technique on at least a portion of the set of column based integer sequences.

* * * * *